(12) United States Patent
Shang et al.

(10) Patent No.: US 11,538,395 B2
(45) Date of Patent: Dec. 27, 2022

(54) SHIFT REGISTER UNIT AND DRIVING METHOD THEREOF, GATE DRIVE CIRCUIT, AND DISPLAY DEVICE

(71) Applicant: BOE Technology Group Co., Ltd., Beijing (CN)

(72) Inventors: Guangliang Shang, Beijing (CN); Jiangnan Lu, Beijing (CN); Can Zheng, Beijing (CN); Hao Zhang, Beijing (CN); Long Han, Beijing (CN); Libin Liu, Beijing (CN); Shiming Shi, Beijing (CN); Dawei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 95 days.

(21) Appl. No.: 17/256,233

(22) PCT Filed: Mar. 18, 2020

(86) PCT No.: PCT/CN2020/080031
§ 371 (c)(1),
(2) Date: Dec. 28, 2020

(87) PCT Pub. No.: WO2021/184260
PCT Pub. Date: Sep. 23, 2021

(65) Prior Publication Data
US 2022/0051608 A1 Feb. 17, 2022

(51) Int. Cl.
*G09G 3/20* (2006.01)
*G11C 19/28* (2006.01)

(52) U.S. Cl.
CPC ........... *G09G 3/2092* (2013.01); *G11C 19/28* (2013.01); *G09G 2310/0286* (2013.01)

(58) Field of Classification Search
CPC ... G09G 2310/0286; G09G 3/32–3291; G09G 2310/0291; G09G 2320/0214; G09G 3/2092; G09G 3/3666; G09G 2330/023; G09G 2310/06–08; G11C 19/28–287;
(Continued)

(56) References Cited

U.S. PATENT DOCUMENTS

| | | | |
|---|---|---|---|
| 2015/0187298 A1* | 7/2015 | Eom | G09G 3/3266 345/99 |
| 2016/0329015 A1* | 11/2016 | Ji | G09G 3/32 |
| 2017/0004775 A1* | 1/2017 | Chen | G11C 19/28 |

(Continued)

*Primary Examiner* — Amr A Awad
*Assistant Examiner* — Aaron Midkiff
(74) *Attorney, Agent, or Firm* — Ling Wu; Stephen Yang; Ling and Yang Intellectual Property

(57) ABSTRACT

A shift register unit includes an input circuit, a first control circuit, a second control circuit and an output circuit. The input circuit is configured to provide signals of the signal input terminal to the first control node, and provide signals of the first power supply terminal or the first clock signal terminal to the second control node. The first control circuit is configured to provide signals of the second power supply terminal or the second clock signal terminal to the first output terminal. The second control circuit is configured to provide signals of the first power supply terminal to the second output terminal. The output circuit is configured to provide signals of the second power supply terminal to the second output terminal.

19 Claims, 10 Drawing Sheets

(58) Field of Classification Search
CPC ........... H01L 29/66484; H01L 29/7831; H01L 29/78645; H01L 29/78648; H01L 29/8124
USPC .......... 345/100, 76–83; 377/64–81; 313/463; 315/169.3
See application file for complete search history.

(56) References Cited

U.S. PATENT DOCUMENTS

| | | | |
|---|---|---|---|
| 2017/0206826 A1* | 7/2017 | Kong | G09G 3/20 |
| 2018/0218682 A1* | 8/2018 | Li | G09G 3/3258 |
| 2018/0277044 A1* | 9/2018 | Chen | G09G 3/20 |

* cited by examiner

SHIFT REGISTER UNIT AND DRIVING METHOD THEREOF, GATE DRIVE CIRCUIT, AND DISPLAY DEVICE

CROSS-REFERENCE TO RELATED APPLICATIONS

The present application is a U.S. National Phase Entry of International Application No. PCT/CN2020/080031 having an international filing date of Mar. 18, 2020. The above-identified application is incorporated into this application by reference in their entirety.

TECHNICAL FIELD

Embodiments of the present disclosure relate to, but are not limited to, the field of display technology, and in particular, to a shift register unit and a driving method thereof, a gate drive circuit, and a display device.

BACKGROUND

In the field of display technology, a gate drive circuit is generally used to send gate drive signals to pixel units in a display area line by line, so as to implement reception of data signals by the pixel units line by line. The gate drive circuit generally includes a plurality of cascaded shift register units, and an output terminal of each of the shift register units is connected with a row of pixel units to send the above gate driving signals to the pixel units.

Because a voltage for controlling pixel brightness changes over time due to leakage of electricity, in order to keep fluctuations of the pixel brightness within a reasonable range, data still need to be refreshed when a static picture is displayed. In order to reduce power consumption, the refresh rate can be reduced. However, an output of a conventional gate drive circuit will generate a relatively large noise at the ultra-low refresh rate (e.g., 1 Hz) due to the influence of leakage of electricity, thereby affecting the display effect.

SUMMARY

The following is a summary of the subject matter described in detail herein. This summary is not intended to limit the protection scope of the claims.

The present invention provides a shift register unit and driving method thereof, a gate drive circuit and a display device.

In a first aspect, the present disclosure provides a shift register unit including an input circuit, a first control circuit, a second control circuit and an output circuit. The input circuit is coupled to a signal input terminal, a first power supply terminal, a first clock signal terminal, a first control node and a second control node respectively, and is configured to provide signals of the signal input terminal to the first control node under the control of the first clock signal terminal, and provide signals of the first power supply terminal or the first clock signal terminal to the second control node under the control of the first clock signal terminal and the first control node. The first control circuit is coupled to the first control node, the second control node, a second clock signal terminal, the first power supply terminal, a second power supply terminal and a first output terminal respectively, and is configured to provide signals of the second power supply terminal or the second clock signal terminal to the first output terminal under the control of the first control node, the second control node and the first power supply terminal. The second control circuit is coupled to the first output terminal, a third clock signal terminal, a fourth clock signal terminal, the first power supply terminal and a second output terminal respectively, and is configured to provide signals of the first power supply terminal to the second output terminal under the control of the first output terminal, the third clock signal terminal and the fourth clock signal terminal. The output circuit is coupled to the first power supply terminal, the second power supply terminal, the first output terminal and the second output terminal respectively, and is configured to provide signals of the second power supply terminal to the second output terminal under the control of the first output terminal, and suppress leakage of the second output terminal through the signals of the first power supply terminal.

In another aspect, the present disclosure provides a gate drive circuit including a plurality of cascaded shift register units as described above; wherein a signal input terminal of a first stage shift register unit is coupled to an initial signal terminal, and a first output terminal of a $N^{th}$ stage shift register unit is coupled to a signal input terminal of a $(N+1)^{th}$ stage shift register unit, N being an integer greater than 0.

In another aspect, the present disclosure provides a display device including the gate drive circuit as described above.

In another aspect, the present disclosure provides a driving method of a shift register unit, which is applied to the shift register unit as described above. The driving method includes: the input circuit provides signals of the signal input terminal to the first control node under the control of the first clock signal terminal, and provides signals of the first power supply terminal or the first clock signal terminal to the second control node under the control of the first clock signal terminal and the first control node; the first control circuit provides signals of the second power supply terminal or the second clock signal terminal to the first output terminal under the control of the first control node, the second control node and the first power supply terminal; the output circuit provides signals of the second power supply terminal to the second output terminal under the control of the first output terminal, or the second control circuit provides signals of the first power supply terminal to the second output terminal under the control of the first output terminal, the third clock signal terminal and the fourth clock signal terminal; and the output circuit suppresses leakage of the second output terminal through the signals of the first power supply terminal.

Other aspects will be understood after the accompanying drawings and the detailed description are read and understood.

BRIEF DESCRIPTION OF DRAWINGS

The accompanying drawings, which are used to provide an understanding of technical solutions of the present disclosure and form a portion of the specification, are intended to, together with embodiments of the present disclosure, explain the technical solutions of the present disclosure, and do not constitute a limitation on the technical solutions of the present disclosure.

DESCRIPTION OF THE REFERENCE SIGNS

Figure 1:
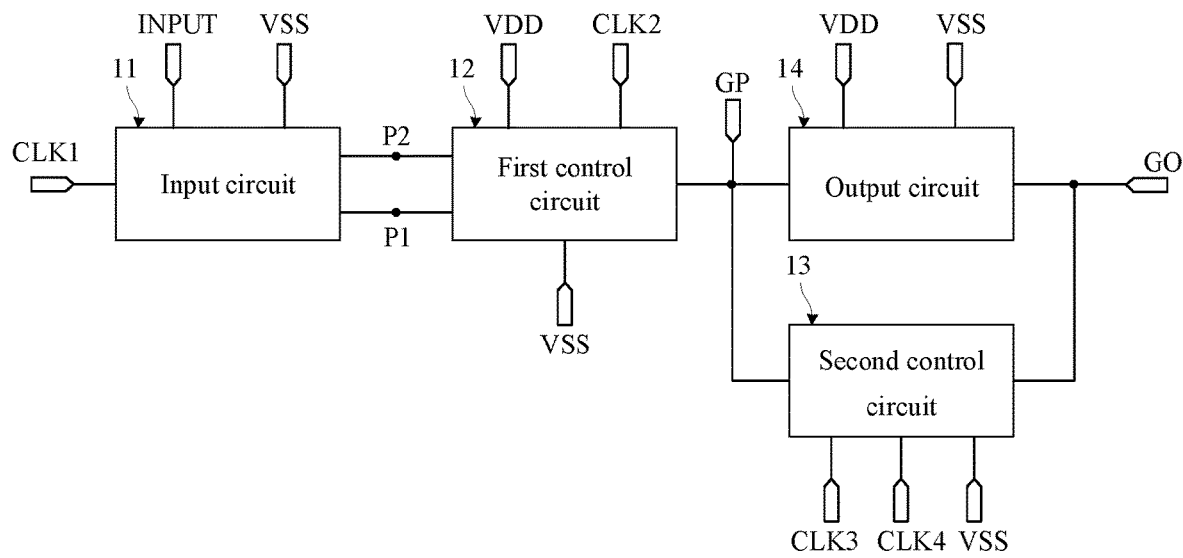
FIG. 1 is a schematic structural diagram of a shift register unit according to an embodiment of the present disclosure.

INPUT—signal input terminal; CLK1—first clock signal terminal; CLK2—second clock signal terminal; CLK3—third clock signal terminal; CLK4—fourth clock signal terminal; VSS—first power supply terminal; VDD—second power supply terminal; GP—first output terminal; GO—second output terminal; P1—first control node; P2—second control node; P3—third control node; P4—fourth control node; P5—fifth control node; P6—sixth control node; T1 to T14—transistors; C1—first capacitor; C2—second capacitor; C3—third capacitor; C4—fourth capacitor; 11—input circuit; 12—first control circuit; 13—second control circuit; 14—output circuit; 141—output sub-circuit; 142—leakage suppression sub-circuit; 20—substrate; 21—barrier layer; 22—first control pole; 23—first insulating layer; 24—active layer; 25—second insulating layer; 26—second control pole; 27—third insulating layer; 281—first pole; 282—second pole; 283—connecting electrode; 260, 280—capacitor electrode; 29—fourth insulating layer.

DETAILED DESCRIPTION

The present disclosure describes a plurality of embodiments, but the description is exemplary rather than limiting, and it is obvious to those of ordinary skill in the art that there may be more embodiments and implementations within the scope of the embodiments described in the present disclosure. Although many possible combinations of features are shown in the drawings and discussed in the embodiments, many other combinations of the disclosed features are also possible. Unless specifically limited, any feature or element of any embodiment may be used in combination with or may replace any other feature or element of any other embodiment.

The present disclosure includes and contemplates combinations of features and elements known to those of ordinary skilled in the art. The disclosed embodiments, features and elements of the present disclosure may be combined with any conventional features or elements to form a unique scheme defined by the claims. Any feature or element of any embodiment may also be combined with features or elements from other schemes to form another unique scheme defined by the claims. Therefore, it should be understood that any feature shown or discussed in the present disclosure may be implemented individually or in any suitable combination. Therefore, the embodiments are not limited except by the limitations made according to the appended claims and their equivalents. In addition, one or more modifications and alterations may be made within the protection scope of the appended claims.

Furthermore, in describing representative embodiments, the specification may have presented a method or process as a specific sequence of steps. However, to the extent that the method or process does not depend on the specific sequence of the steps described herein, the method or process should not be limited to the specific sequence of the steps. As understood by one of ordinary skill in the art, other sequences of the steps are also possible. Therefore, the specific sequence of the steps set forth in the specification should not be interpreted as a limitation to the claims. Furthermore, the claims for the method or process should not be limited to its steps performed in the written order, and those skilled in the art can easily understand that these sequences can be varied and still remain within the spirit and scope of the embodiments of the present disclosure.

In the drawings, the size of a constituent element, or the thickness or area of a layer, is sometimes exaggerated for clarity. Therefore, an implementation of the present disclosure is not necessarily limited to the size shown, and the shape and size of each component in the drawings do not reflect true proportions. In addition, the drawings schematically show ideal examples, and an implementation of the present disclosure is not limited to the shapes or values shown in the drawings.

Unless otherwise defined, technical terms or scientific terms used in the present disclosure shall have ordinary meanings understood by those of ordinary skills in the art to which the present disclosure belongs. The words "first", "second" and the like used in the present disclosure do not indicate any order, quantity or importance, but are only used to distinguish different components. In the present disclosure, "a plurality of" may mean two or more than two. Similar word such as "including" or "containing" mean that elements or articles appearing before the word cover elements or articles listed after the word and their equivalents, and do not exclude other elements or articles. Terms such as "coupled", "connected" or "linked" or the like are not limited to physical or mechanical connections, but may include electrical connections, whether direct or indirect. "Electrical connection" includes the case where constituent elements are connected together through an element with certain electrical effects. "The element with certain electrical effects" is not particularly limited as long as it can transmit and receive electrical signals between the connected constituent elements. Examples of "the element with certain electrical effects" include not only electrodes and wiring, but also switching elements such as transistors, resistors, inductors, capacitors, and other elements with one or more functions.

In order to keep the following description of the embodiments of the present disclosure clear and concise, detailed description of some of known functions and known components are omitted in the present disclosure. The accompanying drawings of the embodiments of the present disclosure only relate to structures involved in the embodiments of the present disclosure, and other structures may be illustrated with reference to general designs.

In the present disclosure, a transistor refers to an element including at least three terminals, namely, a gate electrode, a drain electrode and a source electrode. The transistor has a channel region between the drain electrode (drain electrode terminal, drain region or drain electrode) and the source electrode (source electrode terminal, source region or source electrode), and current can flow through the drain electrode, channel region and source electrode. In the present disclosure, the channel region refers to a region through which the current mainly flows.

Functions of "the source electrode" and "the drain electrode" are sometimes interchanged when transistors with opposite polarities are used or when the direction of current in operation of a circuit changes. Therefore, in the present disclosure, "the source electrode" and "the drain electrode" can be exchanged with each other.

Transistors used in all embodiments of the present disclosure may be thin film transistors or field effect tubes or other devices with same characteristics. Exemplarily, thin film transistors used in the embodiments of the present disclosure may be low-temperature polysilicon thin film transistors or oxide thin film transistors. Since a source and a drain of a transistor used here are symmetrical, the source and the drain may be interchanged. In the embodiments of the present disclosure, in order to distinguish two electrodes of the transistor other than its gate, one of the two electrodes is referred to as a first electrode and the other is referred to as a second electrode. The first electrode may be a source or a drain, and the second electrode may be a drain or a source. In addition, the gate of the transistor is referred to as a control electrode. Furthermore, the thin film transistor or field effect transistor may be a p-type transistor or an n-type transistor.

The embodiments of the present disclosure provide a shift register unit, a driving method thereof, a gate drive circuit, and a display device, so as to reduce the influence of leakage on an output terminal to ensure the output stability of the shift register unit under low-frequency driving, thereby achieving the generation of the control signals required for low-frequency driving of pixels.

FIG. 1 is a schematic structural diagram of a shift register unit according to an embodiment of the present disclosure. As shown in FIG. 1, the shift register unit provided in the embodiment of the present disclosure includes an input circuit 11, a first control circuit 12, a second control circuit 13 and an output circuit 14.

In this embodiment, the input circuit 11 is coupled to a signal input terminal INPUT, a first power supply terminal VSS, a first clock signal terminal CLK1, a first control node P1 and a second control node P2 respectively, and is configured to provide signals of the signal input terminal INPUT to the first control node P1 under the control of the first clock signal terminal CLK1, and provide signals of the first power supply terminal VSS or the first clock signal terminal CLK1 to the second control node P2 under the control of the first clock signal terminal CLK1 and the first control node P1. The first control circuit 12 is coupled to the first control node P1, the second control node P2, a second clock signal terminal CLK2, the first power supply terminal VSS, a second power supply terminal VDD and a first output terminal GP respectively, and is configured to provide signals of the second power supply terminal VDD or the second clock signal terminal CLK2 to the first output terminal GP under the control of the first control node P1, the second control node P2 and the first power supply terminal VSS. The second control circuit 13 is coupled to the first output terminal GP, a third clock signal terminal CLK3, a fourth clock signal terminal CLK4, the first power supply terminal VSS and a second output terminal GO respectively, and is configured to provide signals of the first power supply terminal VSS to the second output terminal GO under the control of the first output terminal GP, the third clock signal terminal CLK3 and the fourth clock signal terminal CLK4. The output circuit 14 is coupled to the first power supply terminal VSS, the second power supply terminal VDD, the first output terminal GP and the second output terminal GO respectively, and is configured to provide signals of the second power supply terminal VDD to the second output terminal GO under the control of the first output terminal GP, and suppress leakage of the second output terminal GO through the signals of the first power supply terminal VSS.

In this embodiment, the first power supply terminal VSS can continuously provide low-level signals, and the second power supply terminal VDD can continuously provide high-level signals. Input signals of the signal input terminal INPUT, the first clock signal terminal CLK1, the second clock signal terminal CLK2, the third clock signal terminal CLK3 and the fourth clock signal terminal CLK4 may be pulse signals.

In this embodiment, phases of output signals of the first output terminal GP are opposite to phases of output signals of the second output terminal GO. For example, gate driving signals provided by the first output terminal GP can be provided to a low-temperature polysilicon thin film transistor in a pixel circuit, and gate driving signals provided by the second output terminal GO can be provided to an oxide thin film transistor in the pixel circuit.

In this embodiment, reverse leakage of the second output terminal can be reduced by suppressing leakage of the second output terminal by the output circuit through the signals of the first power supply terminal, so as to ensure the output stability of the shift register unit under low-frequency driving and achieving the generation of the control signals required for low-frequency driving of pixels.

Figure 2:
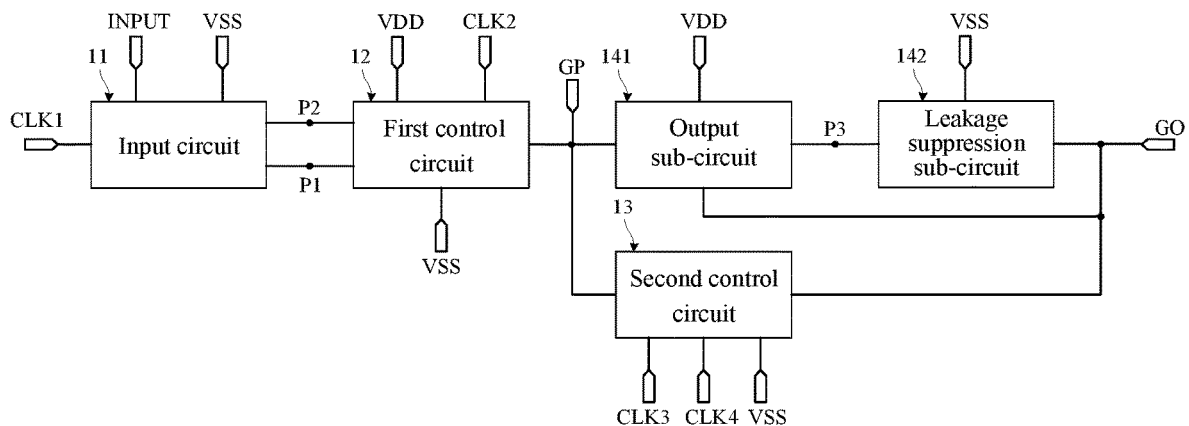
FIG. 2 is a schematic structural diagram of an output circuit according to an embodiment of the present disclosure.

FIG. 2 is a schematic structural diagram of an output circuit according to an embodiment of the present disclosure. As shown in FIG. 2, the output circuit in a shift register unit provided in this embodiment includes an output sub-circuit 141 and a leakage suppression sub-circuit 142. The output sub-circuit 141 is coupled to the first output terminal GP, the second power supply terminal VDD, a third control node P3 and the second output terminal GO respectively, and is configured to provide signals of the second power supply terminal VDD to the third control node P3 under the control of the first output terminal GP, and switch on the third control node P3 and the second output terminal GO under the control of the first output terminal GP. The leakage suppression sub-circuit 142 is coupled to the first power supply terminal VSS, the second output terminal GO and the third control node P3 respectively, and is configured to provide signals of the first power supply terminal VSS to the third control node P3 under the control of the second output terminal GO to suppress leakage of the second output terminal GO.

In this embodiment, the leakage of the second output terminal can be reduced through the leakage suppression sub-circuit, to ensure the output stability of the shift register unit under low-frequency driving, thereby achieving switching control signals required for low-frequency driving of pixels.

Figure 3:
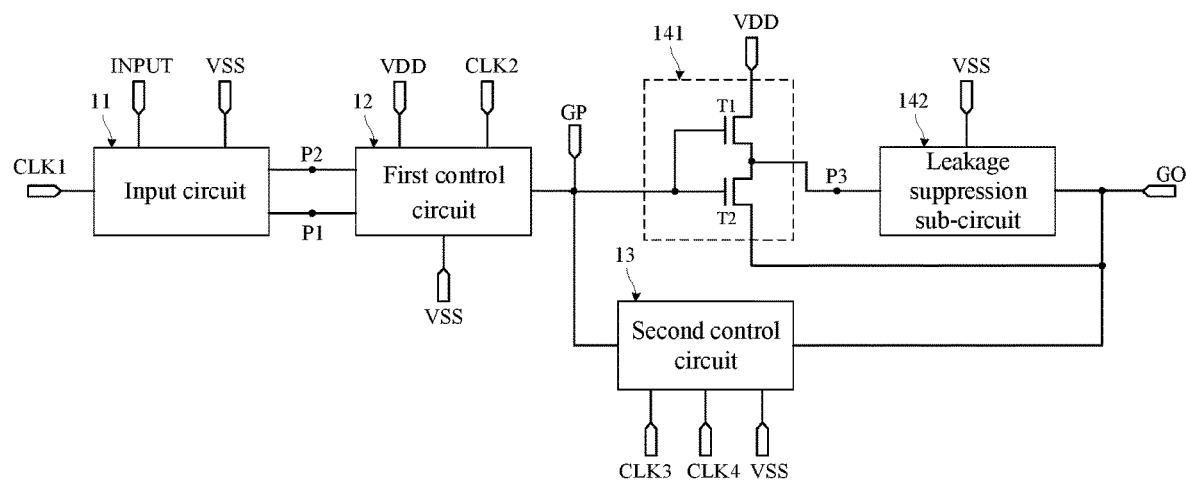
FIG. 3 is an equivalent circuit diagram of an output sub-circuit according to an embodiment of the present disclosure.

FIG. 3 is an equivalent circuit diagram of an output sub-circuit according to an embodiment of the present disclosure. As shown in FIG. 3, the output sub-circuit 141 in a shift register unit provided in this embodiment includes a first transistor T1 and a second transistor T2. A control electrode of the first transistor T1 is coupled to the first output terminal GP, a first electrode of the first transistor T1 is coupled to the second power supply terminal VDD, and a second electrode of the first transistor T1 is coupled to the third control node P3. A control electrode of the second transistor T2 is coupled to the first output terminal GP, a first electrode of the second transistor T2 is coupled to the third control node P3, and a second electrode of the second transistor T2 is coupled to the second output terminal GO.

In this embodiment, an exemplary structure of the output sub-circuit is shown in FIG. 3. Those skilled in the art may easily understand that implementations of the output sub-circuit are not limited to this as long as its functions can be achieved.

Figure 4:
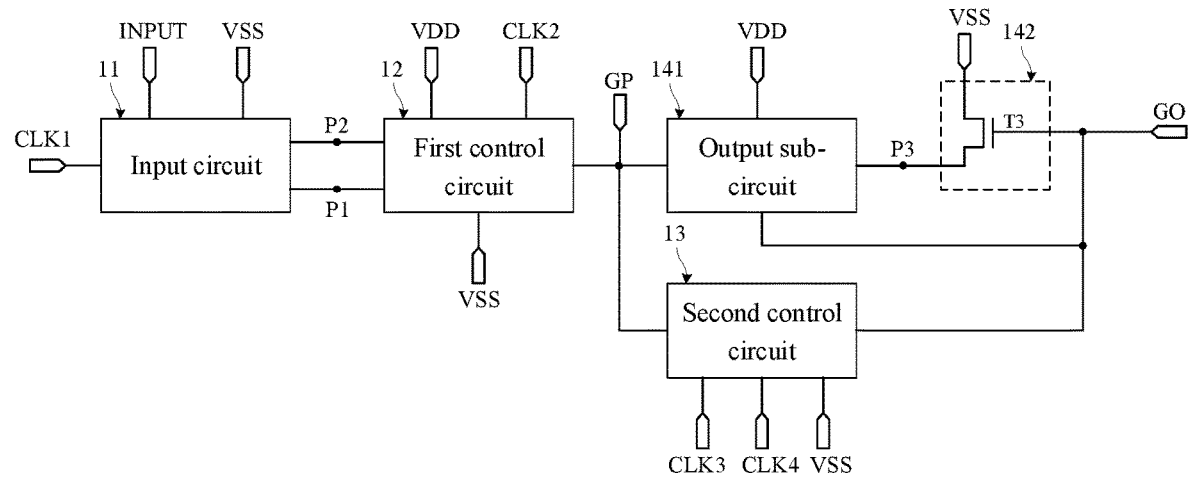
FIG. 4 is an equivalent circuit diagram of a leakage suppression sub-circuit according to an embodiment of the present disclosure.

FIG. 4 is an equivalent circuit diagram of a leakage suppression sub-circuit according to an embodiment of the present disclosure. As shown in FIG. 4, the leakage suppression sub-circuit 142 in a shift register unit provided in this embodiment includes a third transistor T3. A control electrode of the third transistor T3 is coupled to the second output terminal GO, a first electrode of the third transistor T3 is coupled to the first power supply terminal VSS, and a second electrode of the third transistor T3 is coupled to the third control node P3.

In this embodiment, an exemplary structure of the leakage suppression sub-circuit is shown in FIG. 4. Those skilled in the art may easily understand that implementations of the leakage suppression sub-circuit are not limited this as long as its functions can be achieved.

Figure 5:
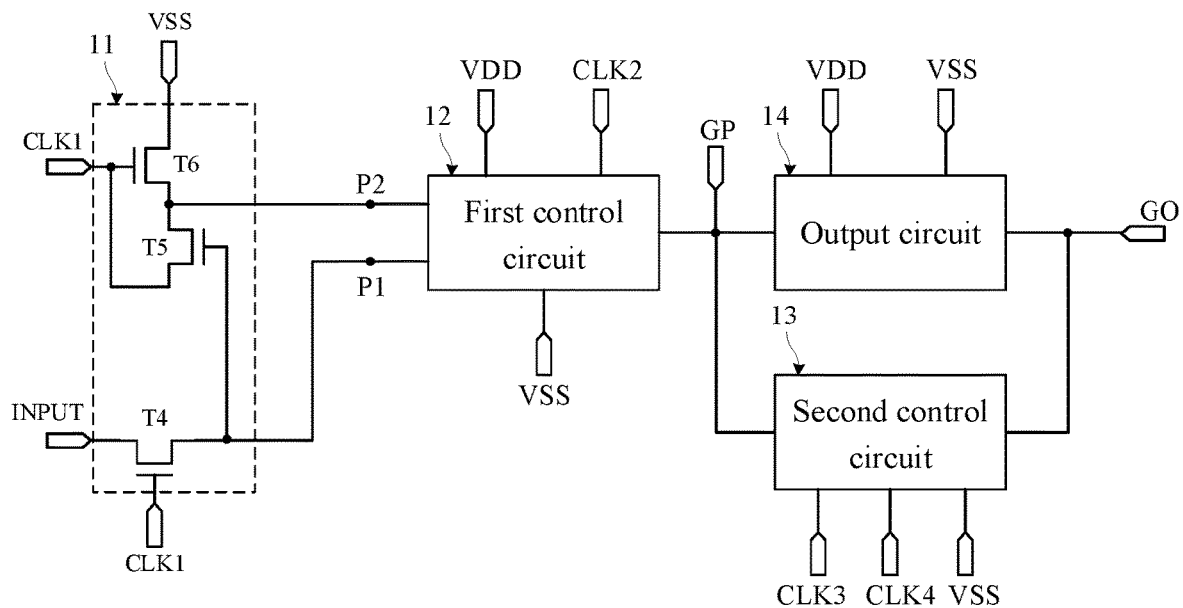
FIG. 5 is an equivalent circuit diagram of an input circuit according to an embodiment of the present disclosure.

FIG. 5 is an equivalent circuit diagram of an input circuit according to an embodiment of the present disclosure. As shown in FIG. 5, the input circuit 11 in a shift register unit provided in this embodiment includes a fourth transistor T4, a fifth transistor T5 and a sixth transistor T6. A control electrode of the fourth transistor T4 is coupled to the first clock signal terminal CLK1, a first electrode of the fourth transistor T4 is coupled to the signal input terminal INPUT, and a second electrode of the fourth transistor T4 is coupled to the first control node P1. A control electrode of the fifth transistor T5 is coupled to the first control node P1, a first electrode of the fifth transistor T5 is coupled to the first clock signal terminal CLK1, and a second electrode of the fifth transistor T5 is coupled to the second control node P2. A control electrode of the sixth transistor T6 is coupled to the first clock signal terminal CLK1, a first electrode of the sixth transistor T6 is coupled to the first power supply terminal VSS, and a second electrode of the sixth transistor T6 is coupled to the second control node P2.

In this embodiment, an exemplary structure of the input circuit is shown in FIG. 5. Those skilled in the art may easily understand that implementations of the input circuit are not limited to this as long as its functions can be achieved.

Figure 6:
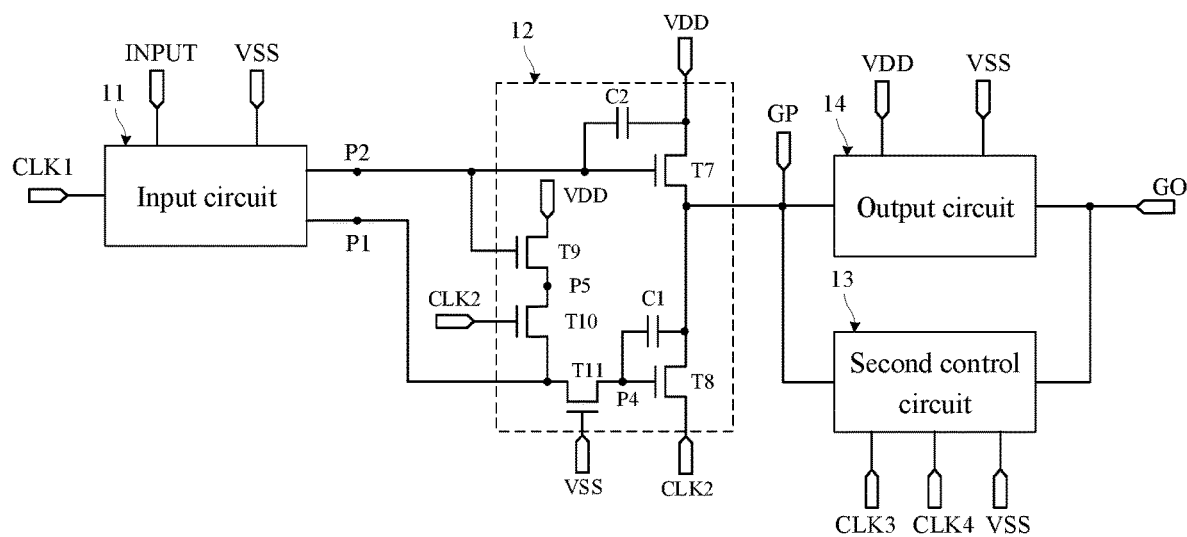
FIG. 6 is an equivalent circuit diagram of a first control circuit according to an embodiment of the present disclosure.

FIG. 6 is an equivalent circuit diagram of a first control circuit according to an embodiment of the present disclosure. As shown in FIG. 6, the first control circuit 12 in a shift register unit provided in this embodiment includes a seventh transistor T7, an eighth transistor T8, a ninth transistor T9, a tenth transistor T10, an eleventh transistor T11, a first capacitor C1 and a second capacitor C2. A control electrode of the seventh transistor T7 is coupled to the second control node P2, a first electrode of the seventh transistor T7 is coupled to the second power supply terminal VDD, and a second electrode of the seventh transistor T7 is coupled to the first output terminal GP. A control electrode of the eighth transistor T8 is coupled to a fourth control node P4, a first electrode of the eighth transistor T8 is coupled to the second clock signal terminal CLK2, and a second electrode of the eighth transistor T8 is coupled to the first output terminal GP. A control electrode of the ninth transistor T9 is coupled to the second control node P2, a first electrode of the ninth transistor T9 is coupled to the second power supply terminal VDD, and a second electrode of the ninth transistor T9 is coupled to a fifth control node P5. A control electrode of the tenth transistor T10 is coupled to the second clock signal terminal CLK2, a first electrode of the tenth transistor T10 is coupled to the fifth control node P5, and a second electrode of the tenth transistor T10 is coupled to the first control node P1. A control electrode of the eleventh transistor T11 is coupled to the first power supply terminal VSS, a first electrode of the eleventh transistor T11 is coupled to the first control node P1, and a second electrode of the eleventh transistor T11 is coupled to the fourth control node P4. A first electrode of the first capacitor C1 is coupled to the first output terminal GP, and a second electrode of the first capacitor C1 is coupled to the fourth control node P4. A first electrode of the second capacitor C2 is coupled to the second power supply terminal VDD, and a second electrode of the second capacitor C2 is coupled to the second control node P2.

In this embodiment, an exemplary structure of the first control circuit is shown in FIG. 6. Those skilled in the art may easily understand that implementations of the first control circuit are not limited to this as long as its functions can be achieved.

Figure 7:
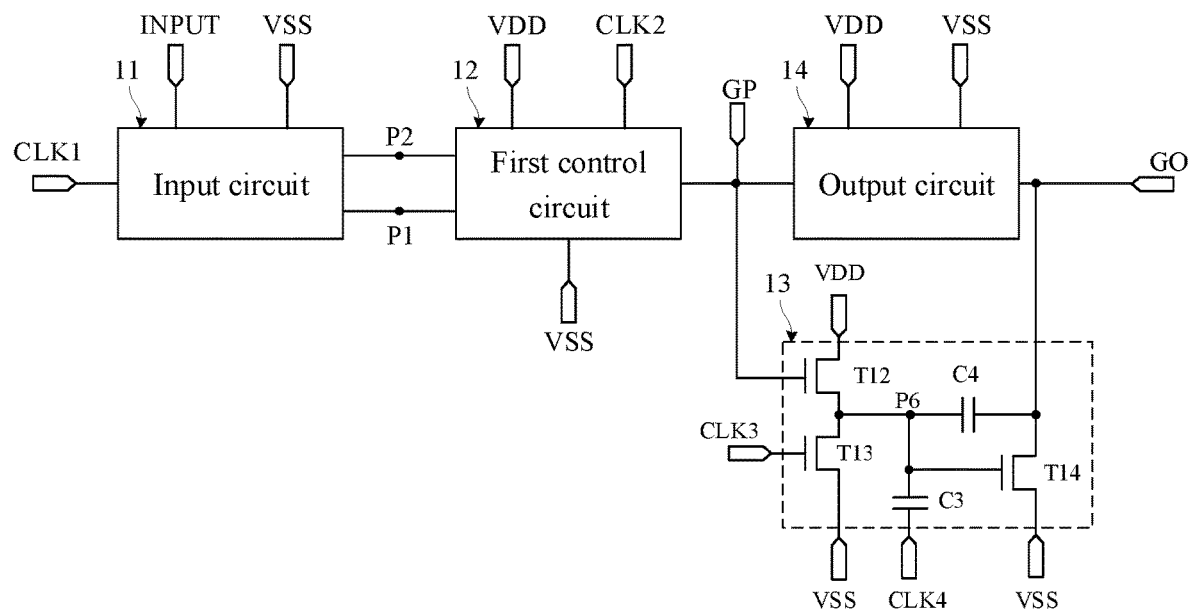
FIG. 7 is an equivalent circuit diagram of a second control circuit according to an embodiment of the present disclosure.

FIG. 7 is an equivalent circuit diagram of a second control circuit according to an embodiment of the present disclosure. As shown in FIG. 7, the second control circuit 13 in a shift register unit provided in this embodiment includes a twelfth transistor T12, a thirteenth transistor T13, a fourteenth transistor T14, a third capacitor C3 and a fourth capacitor C4. A control electrode of the twelfth transistor T12 is coupled to the first output terminal GP, a first electrode of the twelfth transistor T12 is coupled to the second power supply terminal VDD, and a second electrode of the twelfth transistor T12 is coupled to a sixth control node P6. A control electrode of the thirteenth transistor T13 is coupled to the third clock signal terminal CLK3, a first electrode of the thirteenth transistor T13 is coupled to the sixth control node P6, and a second electrode of the thirteenth transistor T13 is coupled to the first power supply terminal VSS. A control electrode of the fourteenth transistor T14 is coupled to the sixth control node P6, a first electrode of the fourteenth transistor T14 is coupled to the first power supply terminal VSS, and a second electrode of the fourteenth transistor T14 is coupled to the second output terminal GO. A first electrode of the third capacitor C3 is coupled to the fourth clock signal terminal CLK4, and a second electrode of the third capacitor C3 is coupled to the sixth control node P6. A first electrode of the fourth capacitor C4 is coupled to the sixth control node P6, and a second electrode of the fourth capacitor C4 is coupled to the second output terminal GO.

In this embodiment, an exemplary structure of the second control circuit is shown in FIG. 7. Those skilled in the art may easily understand that implementations of the second control circuit are not limited to this as long as its functions can be achieved.

Figure 8:
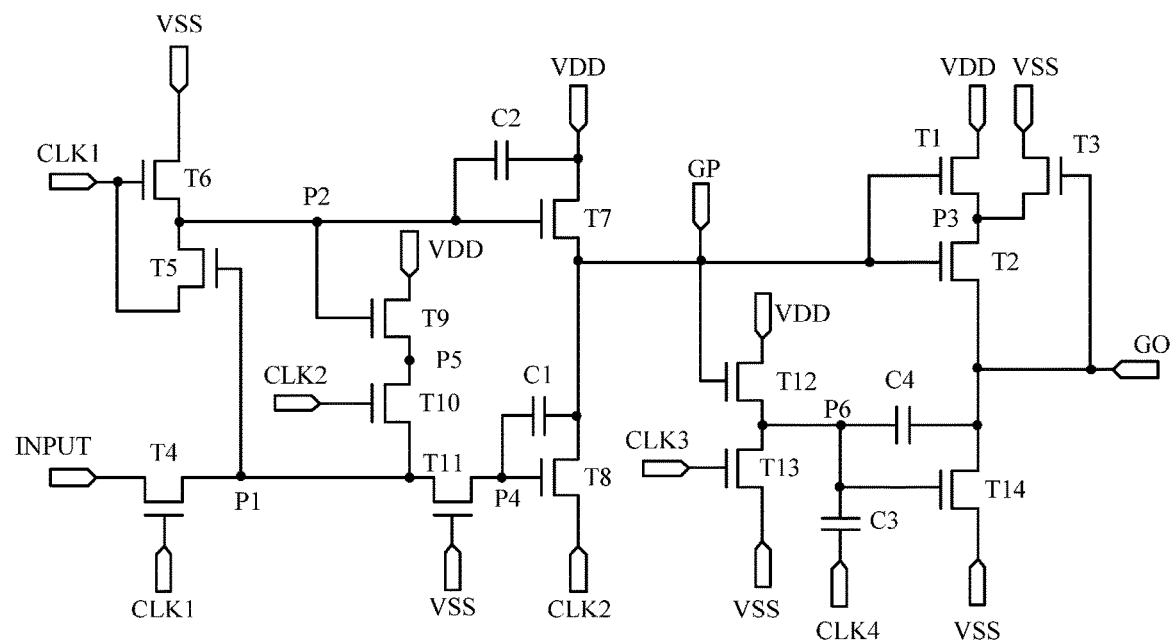
FIG. 8 is an equivalent circuit diagram of a shift register unit according to an embodiment of the present disclosure.

FIG. 8 is an equivalent circuit diagram of a shift register unit according to an embodiment of the present disclosure. As shown in FIG. 8, the shift register unit provided in the embodiment of the present disclosure includes an input circuit, a first control circuit, a second control circuit and an output circuit. The output circuit includes a first transistor T1, a second transistor T2 and a third transistor T3. The input circuit includes a fourth transistor T4, a fifth transistor T5 and a sixth transistor T6. The first control circuit includes a seventh transistor T7, an eighth transistor T8, a ninth transistor T9, a tenth transistor T10, an eleventh transistor T11, a first capacitor C1 and a second capacitor C2. The second control circuit includes a twelfth transistor T12, a thirteenth transistor T13, a fourteenth transistor T14, a third capacitor C3 and a fourth capacitor C4.

In this embodiment, a control electrode of the first transistor T1 is coupled to the first output terminal GP, a first electrode of the first transistor T1 is coupled to the second power supply terminal VDD, and a second electrode of the first transistor T1 is coupled to the third control node P3. A control electrode of the second transistor T2 is coupled to the first output terminal GP, a first electrode of the second transistor T2 is coupled to the third control node P3, and a second electrode of the second transistor T2 is coupled to the second output terminal GO. A control electrode of the third transistor T3 is coupled to the second output terminal GO, a first electrode of the third transistor T3 is coupled to the first power supply terminal VSS, and a second electrode of the third transistor T3 is coupled to the third control node P3. A control electrode of the fourth transistor T4 is coupled to the first clock signal terminal CLK1, a first electrode of the fourth transistor T4 is coupled to the signal input terminal INPUT, and a second electrode of the fourth transistor T4 is coupled to the first control node P1. A control electrode of the fifth transistor T5 is coupled to the first control node P1, a first electrode of the fifth transistor T5 is coupled to the first clock signal terminal CLK1, and a second electrode of the fifth transistor T5 is coupled to the second control node P2. A control electrode of the sixth transistor T6 is coupled to the first clock signal terminal CLK1, a first electrode of the sixth transistor T6 is coupled to the first power supply terminal VSS, and a second electrode of the sixth transistor T6 is coupled to the second control node P2. A control electrode of the seventh transistor T7 is coupled to the second control node P2, a first electrode of the seventh transistor T7 is coupled to the second power supply terminal VDD, and a second electrode of the seventh transistor T7 is coupled to the first output terminal GP. A control electrode of the eighth transistor T8 is coupled to the fourth control node P4, a first electrode of the eighth transistor T8 is coupled to the second clock signal terminal CLK2, and a second electrode of the eighth transistor T8 is coupled to the first output terminal GP. A control electrode of the ninth transistor T9 is coupled to the second control node P2, a first electrode of the ninth transistor T9 is coupled to the second power supply terminal VDD, and a second electrode of the ninth transistor T9 is coupled to the fifth control node P5. A control electrode of the tenth transistor T10 is coupled to the second clock signal terminal CLK2, a first electrode of the tenth transistor T10 is coupled to the fifth control node P5, and a second electrode of the tenth transistor T10 is coupled to the first control node P1. A control electrode of the eleventh transistor T11 is coupled to the first power supply terminal VSS, a first electrode of the eleventh transistor T11 is coupled to the first control node P1, and a second electrode of the eleventh transistor T11 is coupled to the fourth control node P4. A control electrode of the twelfth transistor T12 is coupled to the first output terminal GP, a first electrode of the twelfth transistor T12 is coupled to the second power supply terminal VDD, and a second electrode of the twelfth transistor T12 is coupled to the sixth control node P6. A control electrode of the thirteenth transistor T13 is coupled to the third clock signal terminal CLK3, a first electrode of the thirteenth transistor T13 is coupled to the sixth control node P6, and a second electrode of the thirteenth transistor T13 is coupled to the first power supply terminal VSS. A control electrode of the fourteenth transistor T14 is coupled to the sixth control node P6, a first electrode of the fourteenth transistor T14 is coupled to the first power supply terminal VSS, and a second electrode of the fourteenth transistor T14 is coupled to the second output terminal GO. A first electrode of the first capacitor C1 is coupled to the first output terminal GP, and a second electrode of the first capacitor C1 is coupled to the fourth control node P4. A first electrode of the second capacitor C2 is coupled to the second power supply terminal VDD, and a second electrode of the second capacitor C2 is coupled to the second control node P2. A first electrode of the third capacitor C3 is coupled to the fourth clock signal terminal CLK4, and a second electrode of the third capacitor C3 is coupled to the sixth control node P6. A first electrode of the fourth capacitor C4 is coupled to the sixth control node P6, and a second electrode of the fourth capacitor C4 is coupled to the second output terminal GO.

In this embodiment, the transistors T1 to T14 may all be N-type thin film transistors or P-type thin film transistors, such that process flows can be unified and process manufacturing procedures can be reduced, contributing to improvement of yield of qualified products. In addition, considering that leakage currents of low-temperature polysilicon thin film transistors and oxide thin film transistors are smaller, the transistors in the embodiments of the present disclosure can be the low-temperature polysilicon thin film transistors or the oxide thin film transistors. In addition, thin film transistors with a bottom gate structure or thin film transistors with a top gate structure can be selected in the embodiments of the present disclosure as long as a switching function can be achieved.

Figure 9:
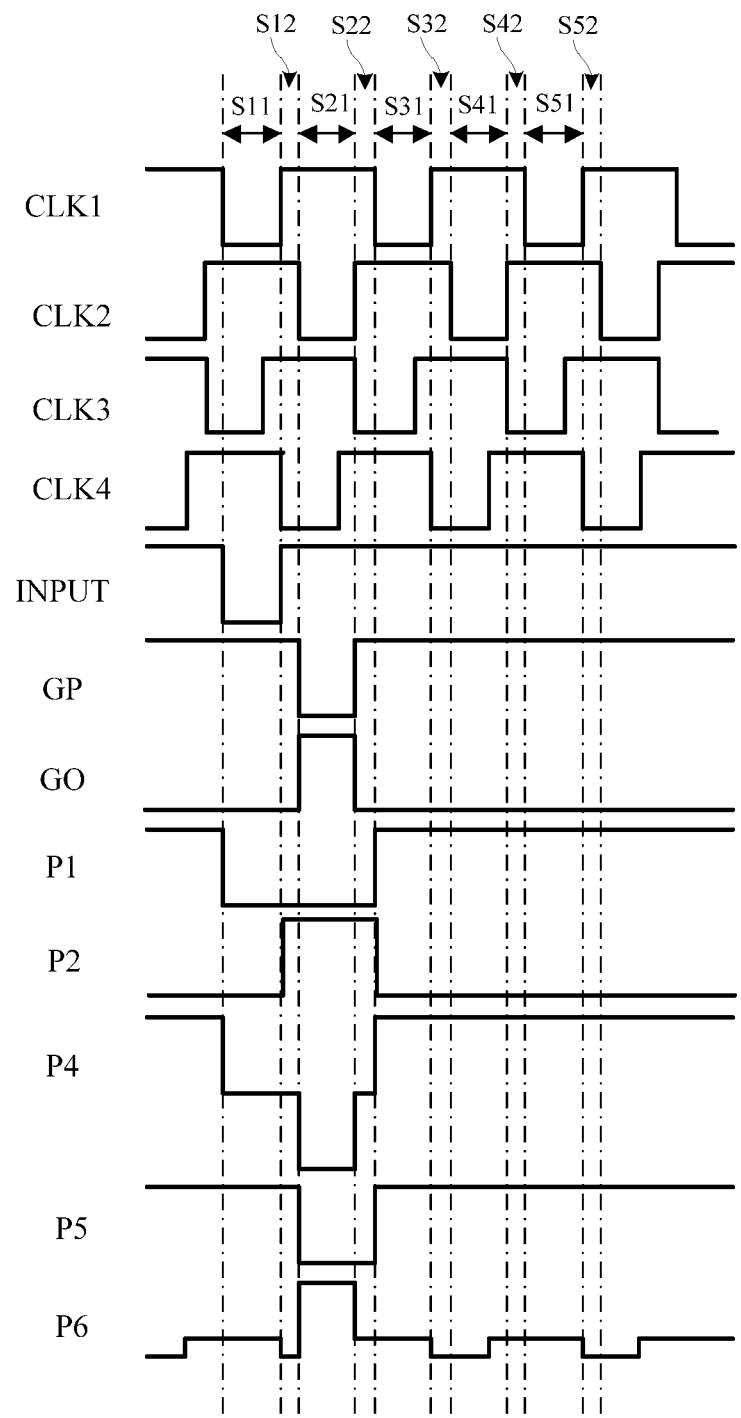
FIG. 9 is an operation timing diagram of a shift register unit according to an embodiment of the present disclosure.

Technical solutions of the embodiments of the present disclosure will be further illustrated below through an operation process of a shift register unit. An operation process of a first stage shift register unit is illustrated below, for example. FIG. 9 is an operation timing diagram of a shift register unit according to an embodiment of the present disclosure.

As shown in FIGS. 8 and 9, the shift register unit of the embodiment of the present disclosure includes 14 transistor units (T1 to T14), 4 capacitor units (C1, C2, C3 and C4), 5 input terminals (INPUT, CLK1, CLK2, CLK3 and CLK4), 2 output terminals (GP and GO) and 2 power supply terminals (VSS and VDD). The first power supply terminal VSS continuously provides low-level signals, and the second power supply terminal VDD continuously provides high-level signals. In order to ensure display quality, thin film transistors in pixel circuits can be prepared by using a low temperature polycrystalline oxide (LTPO) process to guarantee a pixel charging speed and smaller parasitic capacitance. In this embodiment, gate driving signals provided by the first output terminal GP can be provided to a low-temperature polysilicon thin film transistor in a pixel circuit, and gate driving signals provided by the second output terminal GO can be provided to an oxide thin film transistor in the pixel circuit. However, this is not limited in the embodiment of the present disclosure.

The operation process of the shift register unit provided in this embodiment includes the following five stages.

The first stage includes an input stage S11 and an input transition stage S12.

At the input phase S11, input signals of the first clock signal terminal CLK1 are at the low level, and the fourth transistor T4 and the sixth transistor T6 are turned on. When the sixth transistor T6 is turned on and input signals of the first power supply terminal VSS are at the low level, the electric potential of the second control node P2 is pulled down. When the fourth transistor T4 is turned on and input signals of the signal input terminal INPUT are at the low level, the electric potential of the first control node P1 is pulled down, so that the fifth transistor T5 is turned on, further ensuring that the electric potential of the second control node P2 is pulled down.

At the input phase S11, because the electric potential of the second control node P2 is pulled down, the seventh transistor T7 and the ninth transistor T9 are turned on. When the seventh transistor T7 is turned on and input signals of the second power supply terminal VDD are at the high level, the electric potential of the first output terminal GP is pulled up. When the ninth transistor T9 is turned on and the input signals of the second power supply terminal VDD are at the high level, the electric potential of the fifth control node P5 is pulled up. When input signals of the second clock signal terminal CLK2 are at the high level, the tenth transistor T10 is turned off. When the input signals of the first power supply terminal VSS are at the low level, the eleventh transistor T11 is turned on, and the electric potential of the fourth control node P4 is pulled down by the electric potential of the first control node P1, so that the eighth transistor T8 is turned on, further ensuring that the electric potential of the first output terminal GP can be pulled up.

At the input stage S11, the twelfth transistor T12, the first transistor T1 and the second transistor T2 are turned off because the electric potential of the first output terminal GP is pulled up. When input signals of the third clock signal terminal CLK3 are at the low level, the thirteenth transistor T13 is turned on, such that the electric potential of the sixth control node P6 can be pulled down. When the input signals of the third clock signal terminal CLK3 are changed from the low level to the high level, the thirteenth transistor T13 is turned off. Because input signals of the fourth clock signal terminal CLK4 are at the high level, the sixth control node P6 will be charged by the action of the third capacitor C3, but the electric potential of the sixth control node P6 can still cause the fourteenth transistor T14 to be turned on, and the output signals of the second output terminal GO are at the low level. Furthermore, the electric potential of the sixth control node P6 can be further lowered by the action of the fourth capacitor C4, thereby avoiding the influence of the threshold voltage of the fourteenth transistor T14. Because the second output terminal GO outputs low-level signals, the third transistor T3 is turned on, and the electric potential of the third control node P3 is pulled down, such that the influence of reverse leakage generated by the first transistor T1 on the output signals of the second output terminal GO can be decreased.

At the input transition stage S12, when the input signals of the first clock signal terminal CLK1 are at the high level, then the fourth transistor T4 and the sixth transistor T6 are turned off, and the electric potential of the first control node P1 is kept at the low level, so that the fifth transistor T5 is turned on, and the electric potential of the second control node P2 is pulled up by the input signals of the first clock signal terminal CLK1. Because the electric potential of the second control node P2 is pulled up, the seventh transistor T7 and the ninth transistor T9 are turned off; when the input signals of the second clock signal terminal CLK2 are at the high level, then the tenth transistor T10 is turned off, and the electric potential of the fifth control node P5 is kept at the high level. When the input signals of the first power supply terminal VSS are at the low level, then the eleventh transistor T11 is turned on, the electric potential of the fourth control node P4 is kept at the low level, and the eighth transistor T8 is turned on, so that the electric potential of the first output terminal GP can be kept at the high level. Because the electric potential of the first output terminal GP is kept at the high level, the twelfth transistor T12, the first transistor T1 and the second transistor T2 are all turned off. When the input signals of the third clock signal terminal CLK3 are at the high level, then the thirteenth transistor T13 is turned off; because both the twelfth transistor T12 and the thirteenth transistor T13 are turned off, and the input signals of the fourth clock signal terminal CLK4 are at the low level, the electric potential of the sixth control node P6 is pulled down, the fourteenth transistor T14 is turned on, and the second output terminal GO outputs low-level signal. Because the second output terminal GO outputs the low-level signals, the third transistor T3 is turned on and the electric potential of the third control node P3 is pulled down, such that the influence of the reverse leakage of the first transistor T1 on the second output terminal GO can be decreased.

The second stage includes an output stage S21 and an output transition stage S22.

At the output stage S21, when the input signals of the first clock signal terminal CLK1 are at the high level, then the fourth transistor T4 and the sixth transistor T6 are turned off, the electric potential of the first control node P1 is kept at the low level, the fifth transistor T5 is turned on, and the electric potential of the second control node P2 is kept at the high level. Furthermore, under the action of the second capacitor C2, the second control node P2 can be further ensured to be kept at the high level.

At the output stage S21, because the electric potential of the second control node P2 is kept at the high level, the seventh transistor T7 and the ninth transistor T9 are turned off. When the input signals of the second clock signal terminal CLK2 are at the low level, then the tenth transistor T10 is turned on, and the electric potential of the fifth control node P5 is pulled down by the first control node P1. When the input signals of the first power supply terminal VSS are at the low level, then the eleventh transistor T11 is turned on, and the electric potential of the fourth control node P4 is further pulled down by the first control node P1 and the fifth control node P5, so that the eighth transistor T8 is turned on, and the electric potential of the first output terminal GP is pulled down by the input signals of the second clock signal terminal CLK2.

At the output stage S21, when the electric potential of the first output terminal GP is pulled down, then the twelfth transistor T12, the first transistor T1 and the second transistor T2 are turned on. When the first transistor T1 and the second transistor T2 are turned on, and the electric potential of the third control node P3 is pulled up, then the second output terminal GO outputs high-level signals. When the input signals of the third clock signal terminal CLK3 are at the high level, the thirteenth transistor T13 is turned off, and the electric potential of the sixth control node P6 is pulled up by the input signals of the second power supply terminal VDD, then the fourteenth transistor T14 is turned off. Because the second output terminal GO outputs high-level signals, the third transistor T3 is turned off, thus the output of the second output terminal GO can not be affected.

At the output transition phase S22, when the input signals of the first clock signal terminal CLK1 are at the high level, the fourth transistor T4 and the sixth transistor T6 are turned off, the electric potential of the first control node P1 is kept at the low level, the fifth transistor T5 is turned on, and the electric potential of the second control node P2 continues to be kept at the high level. Furthermore, under the action of the second capacitor C2, the second control node P2 is further ensured to be kept at the high level. Because the electric potential of the second control node P2 is kept at the high level, the seventh transistor T7 and the ninth transistor T9 are turned off. When the input signals of the second clock signal terminal CLK2 are at the high level, the tenth transistor T10 is turned off, and the electric potential of the fifth control node P5 is kept at the low level. The electric potential of the first power supply terminal VSS is at the low level, the eleventh transistor T11 is turned on, the electric potential of the fourth control node P4 is pulled down by the first control node P1, so that the eighth transistor T8 is turned on, and the electric potential of the first output terminal GP is pulled up by the input signals of the second clock signal terminal CLK2. When the electric potential of the first output terminal GP is pulled up, then the twelfth transistor T12, the first transistor T1 and the second transistor T2 are turned off. When the input signals of the third clock signal terminal CLK3 are at the low level, then the thirteenth transistor T13 is turned on, and the electric potential of the sixth control node P6 is pulled down by the input signals of the first power supply terminal VSS. Because the input signals of the fourth clock signal terminal CLK4 are at the high level, the sixth control node P6 will be charged by the action of the third capacitor C3, but the electric potential of the sixth control node P6 can still cause the fourteenth transistor T14 to be turned on, and the second output terminal GO outputs the low-level signals. Furthermore, the electric potential of the sixth control node P6 can be further lowered by the action of the fourth capacitor C4, thereby avoiding the influence of the threshold voltage of the fourteenth transistor T14. Because the second output terminal GO outputs the low-level signals, the third transistor T3 is turned on and the electric potential of the third control node P3 is pulled down, such that the influence of the reverse leakage of the first transistor T1 on the second output terminal GO can be decreased.

The third stage includes a reset stage S31 and a reset transition stage S32.

In the reset stage S31, when the input signals of the first clock signal terminal CLK1 are at the low level, then the fourth transistor T4 and the sixth transistor T6 are turned on, and the electric potential of the second control node P2 is pulled down by the input signals of the first power supply terminal VSS. When the input signal of the signal input terminal INPUT are at the high level, then the electric potential of the first control node P1 is pulled up, so that the fifth transistor T5 is turned off.

At the reset stage S31, because the electric potential of the second control node P2 is pulled down, the seventh transistor T7 and the ninth transistor T9 are turned on. When the seventh transistor T7 is turned on and the input signals of the second power supply terminal VDD are at the high level, then the electric potential of the first output terminal GP can be kept at the high level. If the ninth transistor T9 is turned on, then the electric potential of the fifth control node P5 is pulled up. When the input signals of the second clock signal terminal CLK2 are at the high level, then the tenth transistor T10 is turned off. When the input signals of the first power supply terminal VSS are at the low level, then the eleventh transistor T11 is turned on, and the electric potential of the fourth control node P4 is pulled up by the first control node P1, so that the eighth transistor T8 is turned off.

At the reset stage S31, the electric potential of the first output terminal GP is kept at the high level, and the twelfth transistor T12, the first transistor T1 and the second transistor T2 are turned off. When the input signals of the third clock signal terminal CLK3 are at the low level, the thirteenth transistor T13 is turned on, such that the electric potential of the sixth control node P6 can be pulled down. When the input signals of the third clock signal terminal CLK3 are changed from the low level to the high level, the thirteenth transistor T13 is turned off. Because the input signals of the fourth clock signal terminal CLK4 are at the high level, the sixth control node P6 will be charged by the action of the third capacitor C3, and the electric potential of the sixth control node P6 can be further lowered by the action of the fourth capacitor C4, thereby avoiding the influence of the threshold voltage of the fourteenth transistor T14, such that the fourteenth transistor T14 is turned on, and the second output terminal GO outputs the low-level signals. Because the second output terminal GO outputs the low-level signals, the third transistor T3 is turned on and the electric potential of the third control node P3 is kept at the low level, such that the influence of the reverse leakage of the first transistor T1 on the output signals of the second output terminal GO can be decreased.

At the reset transition stage S32, when the input signals of the first clock signal terminal CLK1 are at the high level, then the fourth transistor T4 and the sixth transistor T6 are turned off, the electric potential of the first control node P1 is kept at high level, the fifth transistor T5 is turned off, and the electric potential of the second control node P2 is kept at the low level. Because the electric potential of the second control node P2 is kept at the low level, the seventh transistor T7 and the ninth transistor T9 are turned on, and the electric potential of the first output terminal GP is kept at the high level. When the input signals of the second clock signal terminal CLK2 are at the high level, then the tenth transistor T10 is turned off, and the electric potential of the fifth control node P5 is kept at the high level. The electric potential of the first power supply terminal VSS is at the low level, then the eleventh transistor T11 is turned on, the electric potential of the fourth control node P4 is kept at the high level, and the eighth transistor T8 is turned off. When the electric potential of the first output terminal GP is kept at the high level, then the twelfth transistor T12, the first transistor T1 and the second transistor T2 are turned off. When the input signals of the third clock signal terminal CLK3 are at the high level, the thirteenth transistor T13 is turned off. When the input signals of the fourth clock signal terminal CLK4 are at the low level, then the sixth control node P6 is discharged through the third capacitor C3, the electric potential of the sixth control node P6 is pulled down, the fourteenth transistor T14 is turned on, and the second output terminal GO outputs the low-level signals. Because the second output terminal GO outputs the low-level signals, the third transistor T3 is turned on and the electric potential of the third control node P3 is kept at the low level, such that the influence of the reverse leakage of the first transistor T1 on the output signals of the second output terminal GO can be decreased.

The fourth stage includes a first holding stage S41 and a first holding transition stage S42.

At the first holding stage S41, when the input signals of the first clock signal terminal CLK1 are at the high level, then the fourth transistor T4 and the sixth transistor T6 are turned off, the input signals of the signal input terminal INPUT are at the high level, the electric potential of the first control node P1 is kept at high level, the fifth transistor T5 is turned off, and the electric potential of the second control node P2 is kept at the low level. Because the electric potential of the second control node P2 is kept at the low level, the seventh transistor T7 and the ninth transistor T9 are turned on, and the electric potential of the first output terminal GP is kept at the high level. When the input signals of the second clock signal terminal CLK2 are at the low level, then the tenth transistor T10 is turned on, and the electric potential of the fifth control node P5 is kept at the high level. The electric potential of the first power supply terminal VSS are at the low level, the eleventh transistor T11 is turned on, the electric potential of the fourth control node P4 is kept at the high level, and the eighth transistor T8 is turned off. In the first holding stage S41, the twelfth transistor T12, the first transistor T1 and the second transistor T2 are turned off because the electric potential of the first output terminal GP is kept at the high level. When the input signals of the third clock signal terminal CLK3 are at the high level, the thirteenth transistor T13 is turned off. Because the input signals of the fourth clock signal terminal CLK4 are changed from the low level to the high level, the sixth control node P6 is charged through the third capacitor C3, and the electric potential of the sixth control node P6 can still cause the fourteenth transistor T14 to be turned on, and the second output terminal GO outputs the low-level signals. Furthermore, the electric potential of the sixth control node P6 can be further lowered by the action of the fourth capacitor C4, thereby avoiding the influence of the threshold voltage of the fourteenth transistor T14. Because the second output terminal GO outputs the low-level signals, the third transistor T3 is turned on, and the electric potential of the third control node P3 is kept at the high level, such that the influence of the reverse leakage of the first transistor T1 on the second output terminal GO can be decreased.

At the first holding transition stage S42, when the input signals of the first clock signal terminal CLK1 are at the high level, then the fourth transistor T4 and the sixth transistor T6 are turned off, the electric potential of the first control node P1 is kept at the high level, the fifth transistor T5 is turned off, and the electric potential of the second control node P2 is kept at the low level. Because the electric potential of the second control node P2 is kept at the low level, the seventh transistor T7 and the ninth transistor T9 are turned on, and the electric potential of the first output terminal GP is kept at the high level. When the input signals of the second clock signal terminal CLK2 are at the high level, then the tenth transistor T10 is turned off, and the electric potential of the fifth control node P5 is kept at the high level. The electric potential of the first power supply terminal VSS is at the low level, the eleventh transistor T11 is turned on, the electric potential of the fourth control node P4 is kept at the high level, and the eighth transistor T8 is turned off. Because the electric potential of the first output terminal GP is kept at the high level, the twelfth transistor T12, the first transistor T1 and the second transistor T2 are turned off. When the input signals of the third clock signal terminal CLK3 are at the low level, then the thirteenth transistor T13 is turned on, and the electric potential of the sixth control node P6 is pulled down. Although the input signals of the fourth clock signal terminal CLK4 are at the high level, the sixth control node P6 can be charged through the third capacitor C3, but the electric potential of the sixth control node P6 can still cause the fourteenth transistor T14 to be turned on, and the second output terminal GO outputs the low-level signals. Because the second output terminal GO outputs the low-level signals, the third transistor T3 is turned on, and the electric potential of the third control node P3 is kept at the high level, such that the influence of the reverse leakage of the first transistor T1 on the second output terminal GO can be decreased.

The fifth stage includes a second holding stage S51 and a second holding transition stage S52.

At the second holding stage S51, when the input signals of the first clock signal terminal CLK1 are at the low level, then the fourth transistor T4 and the sixth transistor T6 are turned on, the input signals of the signal input terminal INPUT are at the high level, the electric potential of the first control node P1 is kept at the high level, the fifth transistor T5 is turned off, and the electric potential of the second control node P2 is kept at the low level. Because the electric potential of the second control node P2 is kept at the low level, the seventh transistor T7 and the ninth transistor T9 are turned on, and the electric potential of the first output terminal GP is kept at the high level. When the input signals of the second clock signal terminal CLK2 are at the high level, then the tenth transistor T10 is turned off, and the electric potential of the fifth control node P5 is kept at the high level. When the electric potential of the first power supply terminal VSS is at the low level, the eleventh transistor T11 is turned on, the electric potential of the fourth control node P4 is kept at the high level, and the eighth transistor T8 is turned off.

At the second holding stage S51, the twelfth transistor T12, the first transistor T1 and the second transistor T2 are turned off because the electric potential of the first output terminal GP is kept at the high level. When the input signals of the third clock signal terminal CLK3 are at the low level, then the thirteenth transistor T13 is turned on to pull down the electric potential of the sixth control node P6. Although the input signals of the fourth clock signal terminal CLK4 are at the high level, the sixth control node P6 will be charged through the third capacitor C3, but the electric potential of the sixth control node P6 can still cause the fourteenth transistor T14 to be turned on, and the second output terminal GO outputs the low-level signals. Because the second output terminal GO outputs the low-level signals, the third transistor T3 is turned on, and the electric potential of the third control node P3 is kept at the high level, such that the influence of the reverse leakage of the first transistor T1 on the second output terminal GO can be decreased.

At the second holding transition stage S52, when the input signals of the first clock signal terminal CLK1 are at the high level, then the fourth transistor T4 and the sixth transistor T6 are turned off, the electric potential of the first control node P1 is kept at the high level, the fifth transistor T5 is turned off, and the electric potential of the second control node P2 is kept at the low level. Because the electric potential of the second control node P2 is kept at the low level, the seventh transistor T7 and the ninth transistor T9 are turned on, and the electric potential of the first output terminal GP is kept at the high level. When the input signals of the second clock signal terminal CLK2 are at the high level, then the tenth transistor T10 is turned off, and the electric potential of the fifth control node P5 is kept at the high level. When the electric potential of the first power supply terminal VSS is at the low level, then the eleventh transistor T11 is turned on, the electric potential of the fourth control node P4 is kept at the high level, and the eighth transistor T8 is turned off. Because the electric potential of the first output terminal GP is kept at the high level, the twelfth transistor T12, the first transistor T1 and the second transistor T2 are turned off. When the input signals of the third clock signal terminal CLK3 are at the high level, then the thirteenth transistor T13 is turned off, the input signals of the fourth clock signal terminal CLK4 are at the low level, the electric potential of the sixth control node P6 is pulled down, the fourteenth transistor T14 is turned on, and the second output terminal GO outputs the low-level signals. Because the second output terminal GO outputs the low-level signals, the third transistor T3 is turned on, and the electric potential of the third control node P3 is kept at the high level, such that the influence of the reverse leakage of the first transistor T1 on the second output terminal GO can be decreased.

After the fifth stage, the fourth stage and the fifth stage can be repeated until the input signals of the signal input terminal are at the low level, and then the process restarts from the first stage.

It is can be known from the operation process of the shift register unit described above that at the first, third, fourth and fifth stages, the third transistor T3 is turned on under the control of the second output terminal GO to provide the signals of the first power supply terminal VSS to the third control node P3, such that the electric potential of the third control node P3 can be kept at the low level, thus reducing the influence of the reverse leakage of the first transistor T1 on the second output terminal GO; while at the second stage, the third transistor T3 is turned off under the control of the second output terminal GO, such that the output of high-level signals by the second output terminal GO will not be affected. In this way, the output stability of the second output terminal under low-frequency driving can be ensured, thereby achieving switching control signals required for low-frequency driving of pixels.

In this embodiment, the falling edge time of the signals of the first clock signal terminal CLK1 is later than the rising edge time of the signals of the second clock signal terminal CLK2, and earlier than the rising edge time of the signals of the first clock signal terminal CLK1, and the rising edge time of the signals of the first clock signal terminal CLK1 is earlier than the falling edge time of the signals of the second clock signal terminal CLK2. The falling edge time of the signals of the third clock signal terminal CLK3 is the same as the rising edge time of the signals of the second clock signal terminal CLK2, and the rising edge time of the signals of the third clock signal terminal CLK3 is earlier than the rising edge time of the signals of the first clock signal terminal CLK1. The falling edge time of the signals of the fourth clock signal terminal CLK4 is the same as the rising edge time of the signals of the first clock signal terminal CLK1, and the rising edge time of the signals of the fourth clock signal terminal CLK4 is earlier than the rising edge time of the signals of the second clock signal terminal CLK2. In this embodiment, the reset time of the second output terminal GO can be controlled by setting the clock signals in this way (the second output terminal GO can be reset at the output transition stage S22), to ensure the output consistency of the first output terminal GP and the second output terminal GO. In this way, it can be ensured that the oxide thin film transistor and the low-temperature polysilicon thin film transistor in the pixel circuit can be turned on and off at the same time without waiting due to differences, thereby increasing pixel charging time and supporting high-resolution or high refresh rate driving.

Figure 10:
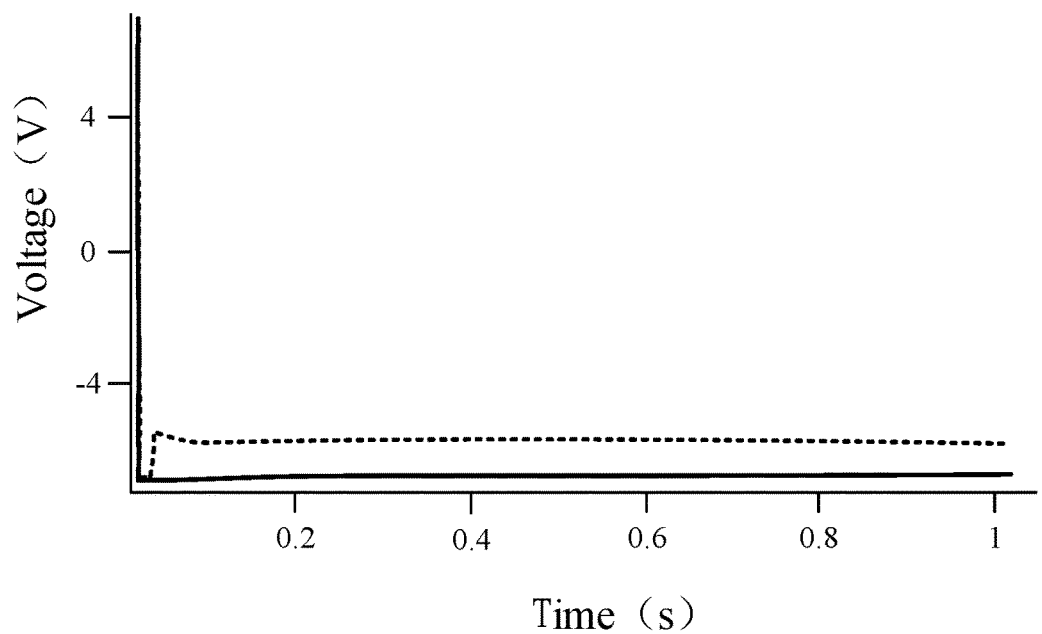
FIG. 10 is a schematic simulation diagram of anti-leakage effect of a shift register unit according to an embodiment of the present disclosure.

FIG. 10 is a schematic simulation diagram of anti-leakage effect of a shift register unit according to an embodiment of the present disclosure. In FIG. 10, a solid line represents output simulation of the shift register unit provided in the embodiment of the present disclosure, and a dash line represents output simulation of the shift register unit without an output circuit with a leakage suppression function. It can be seen from FIG. 10 that output noise of the shift register unit without the output circuit with the leakage suppression function under low-frequency driving may reach 1.46V, while output noise of the shift register unit provided in the embodiment of the disclosure under low-frequency driving is only 0.21V, so the output noise is decreased significantly.

Figure 11:
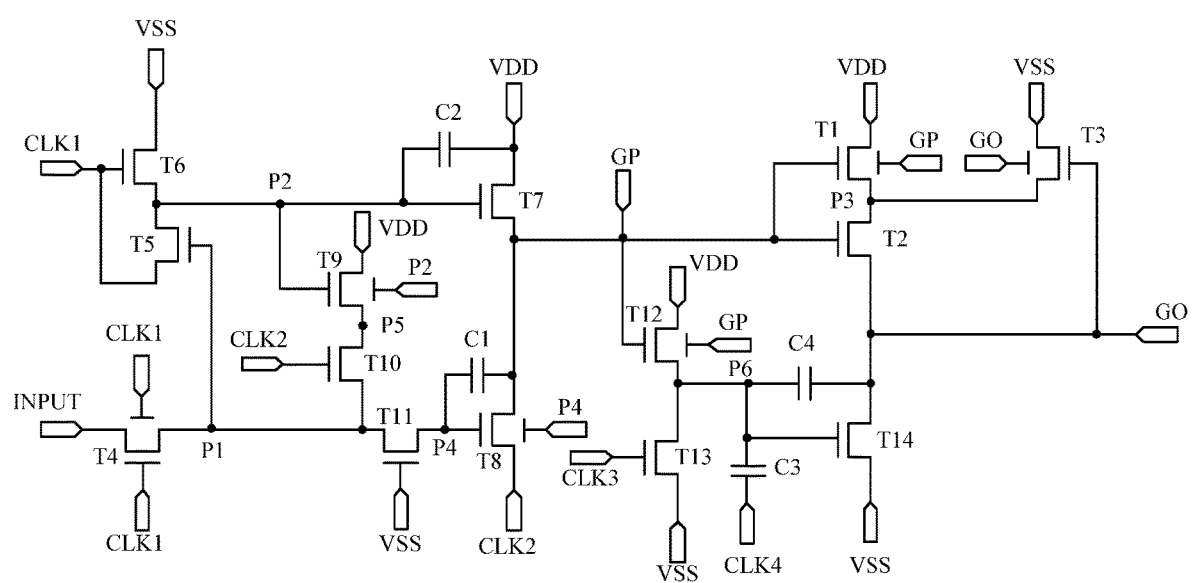
FIG. 11 is an equivalent circuit diagram of a shift register unit according to another embodiment of the present disclosure.

FIG. 11 is an equivalent circuit diagram of a shift register unit according to another embodiment of the present disclosure. As shown in FIG. 11, the shift register unit provided in this exemplary embodiment includes an input circuit, a first control circuit, a second control circuit and an output circuit. The output circuit includes a first transistor T1, a second transistor T2 and a third transistor T3. The input circuit includes a fourth transistor T4, a fifth transistor T5 and a sixth transistor T6. The first control circuit includes a seventh transistor T7, an eighth transistor T8, a ninth transistor T9, a tenth transistor T10, an eleventh transistor T11, a first capacitor C1 and a second capacitor C2. The second control circuit includes a twelfth transistor T12, a thirteenth transistor T13, a fourteenth transistor T14, a third capacitor C3 and a fourth capacitor C4.

The shift register unit provided in this exemplary embodiment is different from the shift register unit shown in FIG. 8 in that in this exemplary embodiment, the first transistor T1, the third transistor T3, the fourth transistor T4, the eighth transistor T8, the ninth transistor T9 and the twelfth transistor T12 are all double-gate transistors, and the control electrode of each of the double-gate transistors includes a first control electrode and a second control electrode, wherein the first control electrode is coupled to the second control electrode.

The shift register unit provided in this exemplary embodiment can also suppress leakage of the second output terminal by the output circuit through the signals of the first power supply terminal, thereby ensuring the output stability of the shift register unit under low-frequency driving and achieving the generation of the control signals required for low-frequency driving of pixels. Furthermore, the shift register unit provided in this exemplary embodiment can ensure the stability of control nodes (e.g., the first output terminal GP, the fifth control node P5, the fourth control node P4, and the third control node P3), and can achieve the purposes of low leakage and fast response speed matching.

Figure 12:
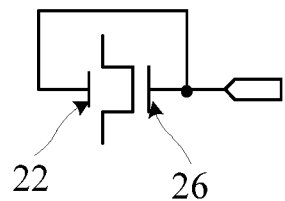
FIG. 12 is a schematic connection diagram of a double-gate transistor according to an embodiment of the present disclosure.
Figure 13:
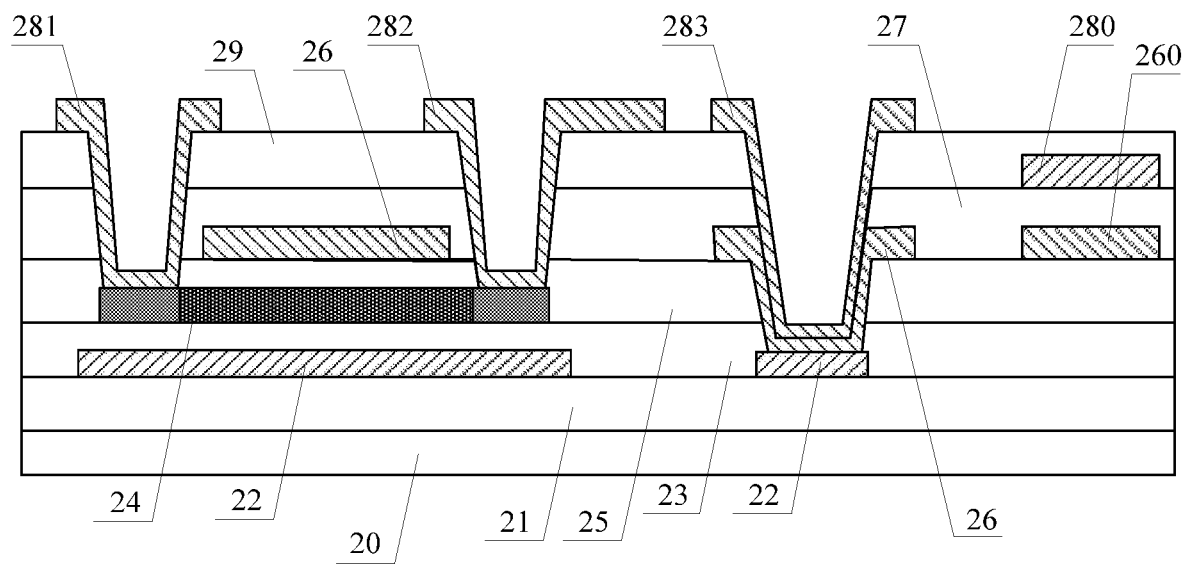
FIG. 13 is a schematic cross-sectional view of a double-gate transistor according to an embodiment of the present disclosure.

FIG. 12 is a schematic connection diagram of a double-gate transistor according to an embodiment of the present disclosure; FIG. 13 is a schematic cross-sectional view of a double-gate transistor according to an embodiment of the present disclosure. As shown in FIG. 12 and FIG. 13, the double-gate transistor according to the embodiment of the present disclosure includes a first control electrode 22, an active layer 24, a second control electrode 26, a first electrode 281 and a second electrode 282 sequentially disposed on a substrate 20. The first control electrode 22 is located below the active layer 24 and the second control electrode 26 is located above the active layer 24. The active layer 24 includes a channel region and doped regions. The first and second electrodes 281 and 282 are respectively coupled to the doped regions at both ends of the channel region of the active layer 24. The first control electrode 22 is coupled to the second control electrode 26.

As shown in FIG. 13, the first control electrode 22 may be a bottom-gate (BG), and the second control electrode 26 may be a top-gate (TG). The first control electrode 22 and the second control electrode 26 share the active layer 24, and the first control electrode 22 can be coupled to the second control electrode 26. The first control electrode 22 can be coupled to the second control electrode 26 and the connection electrode 283 in turn to achieve coupling with a gate line (not shown in the figure). The second control electrode 26 may be directly coupled to the gate line.

As shown in FIG. 13, a barrier layer 21 is disposed between the substrate 20 and the first control electrode 22. A first insulating layer 23 is disposed between the first control electrode 22 and the active layer 24. A second insulating layer 25 is disposed between the active layer 24 and the second control electrode 26. The capacitor electrode 260 and the second control electrode 26 are disposed on the same layer and can be formed at the same time through the same patterning process. A third insulating layer 27 is disposed between the capacitor electrode 280 and the capacitor electrode 260, and the capacitor electrode 280 is opposite to the capacitor electrode 260. The first electrode 281, the second electrode 282 and the connecting electrode 283 are disposed on the same layer and can be formed at the same time through the same patterning process, and a fourth insulating layer 29 is disposed between the capacitor electrode 280 and the first electrode 281, the second electrode 282 and the connecting electrode 283. The first electrode 281 and the second electrode 282 are coupled to the doped regions at both ends of the channel region of the active layer 24 by etching away via holes of the second insulating layer 25, the third insulating layer 27 and the fourth insulating layer 29, respectively. The second control electrode 26 is coupled to the first control electrode 22 by etching away via holes of the first insulating layer 23 and the second insulating layer 25. The connection electrode 283 is coupled to the second control electrode 26 by etching away the via holes of the third insulating layer 27 and the fourth insulating layer 29.

The substrate 20 may be made of glass or other materials. The Barrier layer 21 may be made of polyimide (PI), polyethylene terephthalate (PET), or a surface-treated polymer soft film, etc. The active layer 24 may be made of amorphous indium gallium zinc oxide (a-IGZO), zinc oxynitride (ZnON), indium zinc tin oxide (IZTO), amorphous silicon (a-Si), polysilicon (p-Si), hexathiophene, polythiophene, etc. The first control electrode 22, the second control electrode 26, the first electrode 281, the second electrode 282, the connecting electrode 283 and the capacitor electrodes 260 and 280 may be made of a metal material, such as argentum (Ag), copper (Cu), aluminum (Al), molybdenum (Mo), or an alloy material of the above metals, such as aluminum neodymium (AlNd) alloy, molybdenum niobium (MoNb) alloy, or a multi-layer metal, such as Mo/Cu/Mo, or a stacked structure formed by metals and transparent conductive materials, such as ITO/Ag/ITO or the like. The first insulating layer 23, the second insulating layer 25, the third insulating layer 27 and the fourth insulating layer 29 may be made of silicon oxide (SiOx), silicon nitride (SiNx), silicon oxynitride (SiON), etc., or a high dielectric constant (High k) material such as aluminum oxide (AlOx), hafnium oxide (HfOx), tantalum oxide (TaOx), etc., and may be a single layer, multiple layers, or a composite layer. Generally, the first insulating layer 23 is called a buffer layer, the second insulating layer 25 and the third insulating layer 27 are called a gate insulating layer (GI), and the fourth insulating layer 29 is called an interlayer insulating layer (ILD).

"The patterning process" mentioned in the embodiment, including deposition of a film layer, coating of photoresist, mask exposure, development, etching, stripping of photoresist, etc., which are known mature preparation processes. Deposition may be performed by using a known process such as sputtering, evaporation, chemical vapor deposition, or the like, coating may be performed by using a known coating process, and etching may be performed by using a known method, which is not limited here.

Figure 14:
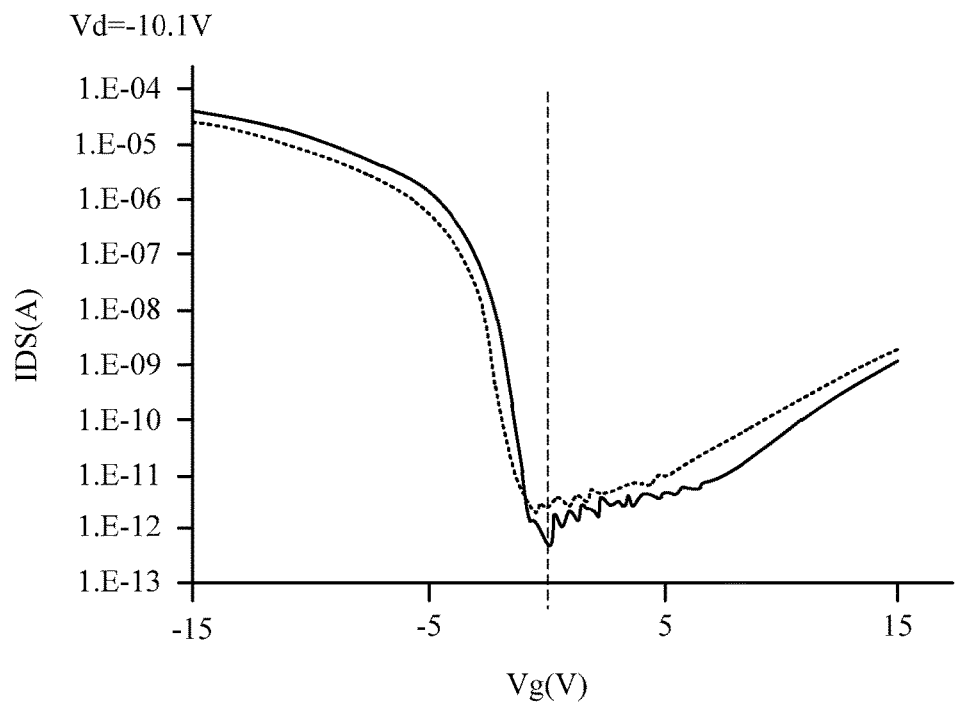
FIG. 14 is a schematic diagram of IV characteristics of a double-gate transistor with a first control electrode and a second control electrode coupled according to an embodiment of the present disclosure.

FIG. 14 is a schematic diagram of IV (volt-ampere) characteristics of a double-gate transistor with a first control electrode and a second control electrode coupled according to an embodiment of the present disclosure. In FIG. 14, a drain voltage of the double gate transistor of this embodiment is Vd=−10.1 V. A dash line represents a plot of a gate voltage Vg (unit: V) versus on-current IDS (unit: A) when a bottom gate voltage is 0V, and the solid line represents a plot of the gate voltage Vg versus on-current IDS when the bottom gate voltage is consistent with a top gate voltage. It can be seen from FIG. 14 that when the gate voltage Vg is 0 volts, the on-current is smaller when the bottom gate voltage is consistent with the top gate voltage. It can be seen that use of the double-gate transistor with the first control electrode and the second control electrode coupled in this embodiment is beneficial to the decrease of the leakage of the thin film transistor, and the driving capability can be improved.

Figure 15:
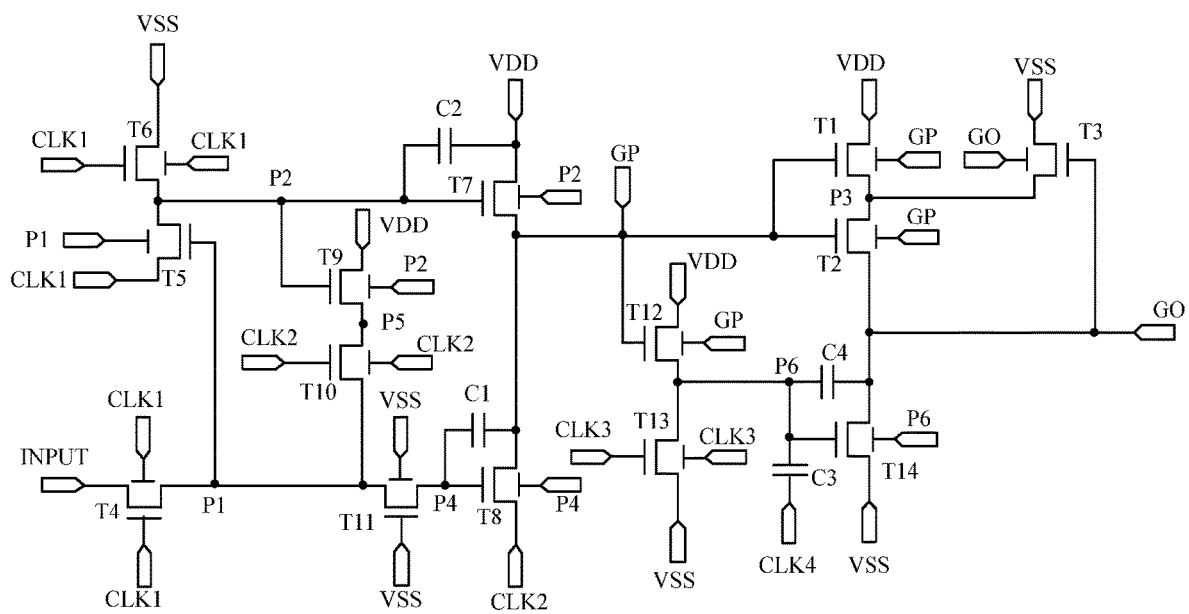
FIG. 15 is an equivalent circuit diagram of a shift register unit according to another embodiment of the present disclosure.

FIG. 15 is an equivalent circuit diagram of a shift register unit according to another embodiment of the present disclosure. As shown in FIG. 15, the shift register unit provided in this exemplary embodiment includes an input circuit, a first control circuit, a second control circuit and an output circuit. The output circuit includes a first transistor T1, a second transistor T2 and a third transistor T3. The input circuit includes a fourth transistor T4, a fifth transistor T5 and a sixth transistor T6. The first control circuit includes a seventh transistor T7, an eighth transistor T8, a ninth transistor T9, a tenth transistor T10, an eleventh transistor T11, a first capacitor C1 and a second capacitor C2. The second control circuit includes a twelfth transistor T12, a thirteenth transistor T13, a fourteenth transistor T14, a third capacitor C3 and a fourth capacitor C4.

The shift register unit provided in this exemplary embodiment is different from the shift register unit shown in FIG. 8 in that in this exemplary embodiment, the first transistor T1 to the fourteenth transistor T14 are all double-gate transistors, and the control electrode of each of the double-gate transistor includes a first control electrode and a second control electrode, wherein the first control electrode is coupled to the second control electrode.

The shift register unit provided in this exemplary embodiment can also suppress leakage of the second output terminal by the output circuit through the signals of the first power supply terminal, thereby ensuring the output stability of the shift register unit under low-frequency driving and achieving the generation of the control signals required for low-frequency driving of pixels. Furthermore, the shift register unit provided in this exemplary embodiment can ensure the stability of each control node, and can achieve the purposes of low leakage and fast response speed matching.

The operation timing of the shift register units shown in FIG. 11 and FIG. 15 can be described with reference to FIG. 9, and will not be repeated herein.

Figure 16:
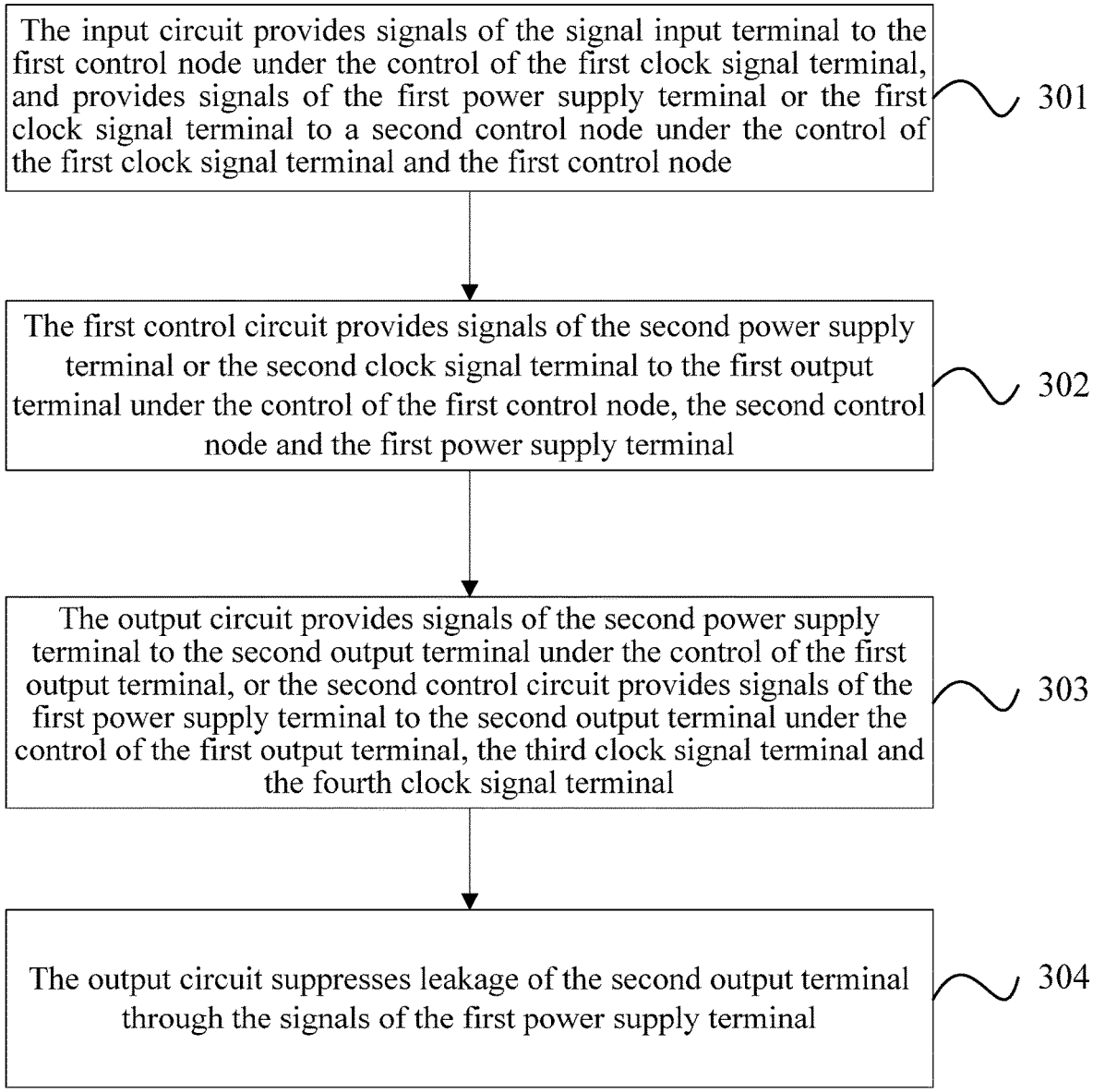
FIG. 16 is a flowchart of a driving method of a shift register unit according to an embodiment of the present disclosure.

An embodiment of the present disclosure also provides a driving method of a shift register unit. FIG. 16 is a flowchart of a driving method of a shift register unit according to an embodiment of the present disclosure. As shown in FIG. 16, the driving method of the shift register unit provided in this embodiment is applied to the shift register unit provided in the above embodiment, and the driving method provided in this embodiment may include the following steps.

In step 301, the input circuit provides signals of the signal input terminal to the first control node under the control of the first clock signal terminal, and provides signals of the first power supply terminal or the first clock signal terminal to a second control node under the control of the first clock signal terminal and the first control node.

In step 302, the first control circuit provides signals of the second power supply terminal or the second clock signal terminal to the first output terminal under the control of the first control node, the second control node and the first power supply terminal.

In step 303, the output circuit provides signals of the second power supply terminal to the second output terminal under the control of the first output terminal, or the second control circuit provides signals of the first power supply terminal to the second output terminal under the control of the first output terminal, the third clock signal terminal and the fourth clock signal terminal.

In step 304, the output circuit suppresses leakage of the second output terminal through the signals of the first power supply terminal.

In an exemplary embodiment, the first transistor to the fourteenth transistor are all p-type transistors. The falling edge time of the signals of the first clock signal terminal CLK1 is later than the rising edge time of the signals of the second clock signal terminal CLK2, and earlier than the rising edge time of the signals of the first clock signal terminal CLK1, and the rising edge time of the signals of the first clock signal terminal CLK1 is earlier than the falling edge time of the signals of the second clock signal terminal CLK2. The falling edge time of the signals of the third clock signal terminal CLK3 is the same as the rising edge time of the signals of the second clock signal terminal CLK2, and the rising edge time of the signals of the third clock signal terminal CLK3 is earlier than the rising edge time of the signals of the first clock signal terminal CLK1. The falling edge time of the signals of the fourth clock signal terminal CLK4 is the same as the rising edge time of the signals of the first clock signal terminal CLK1, and the rising edge time of the signals of the fourth clock signal terminal CLK4 is earlier than the rising edge time of the signals of the second clock signal terminal CLK2.

The driving method of the shift register unit, the structure of the shift register unit and its operation process provided in this embodiment have been explained in the above embodiments, and will not be repeated herein.

Figure 17:
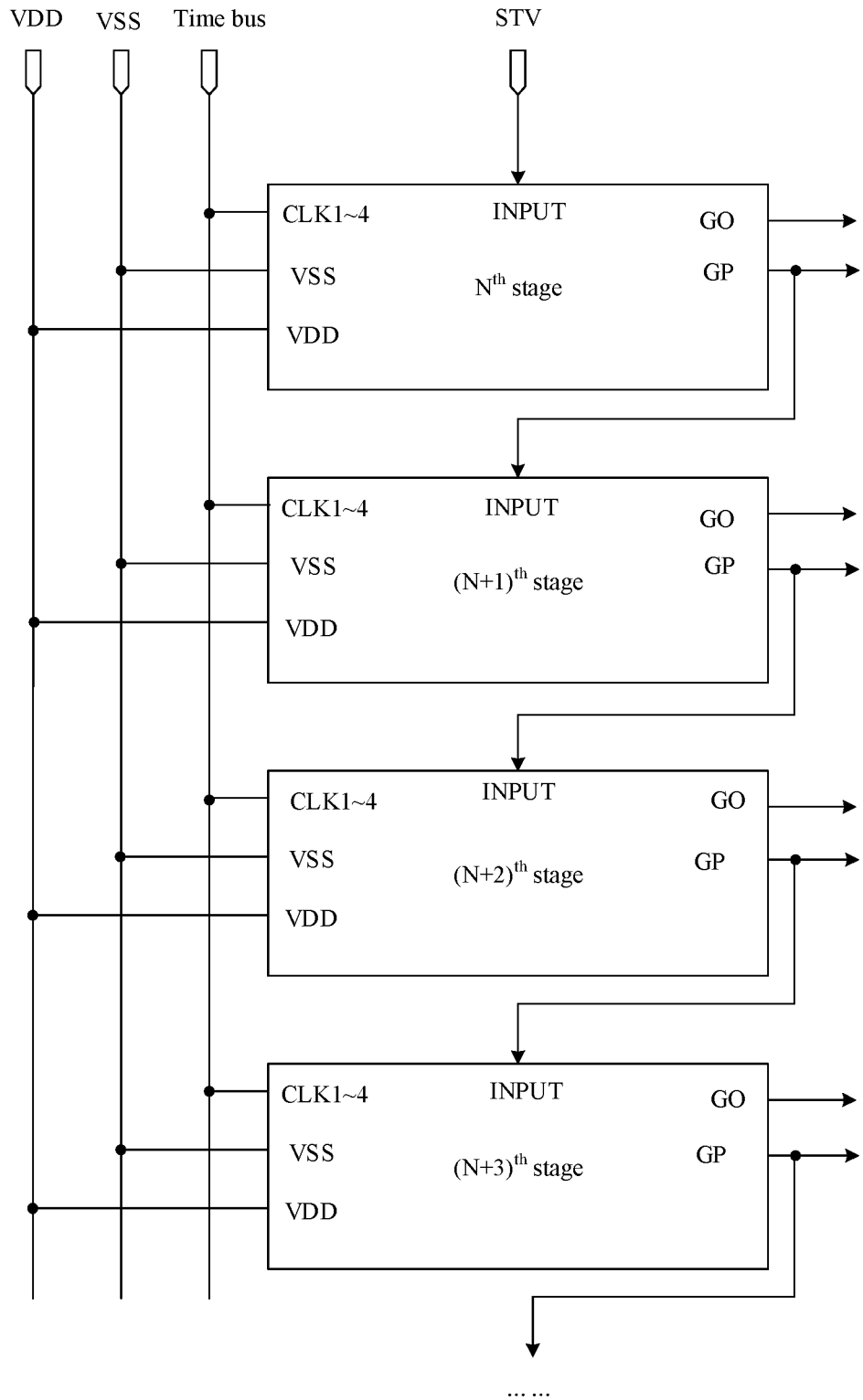
FIG. 17 is a schematic diagram of a gate drive circuit according to an embodiment of the present disclosure.

An embodiment of the present disclosure also provides a gate drive circuit. FIG. 17 is a schematic diagram of a gate drive circuit according to an embodiment of the present disclosure. As shown in FIG. 17, the gate drive circuit provided in this embodiment includes a plurality of cascaded shift register units, which are the shift registers units provided in the above embodiments, and their implementation principles and effects are similar, and will not be described in detail here.

In this embodiment, a signal input terminal of a first stage shift register unit is coupled to an initial signal terminal STV, and a first output terminal of a $N^{th}$ stage shift register unit is coupled to a signal input terminal of a $(N+1)^{th}$ stage shift register unit, N being an integer greater than 0.

An embodiment of the present disclosure further provides a display device including the gate drive circuit according to the previous embodiment. The display device may a mobile phone, a tablet computer, a television, a display, a notebook computer, a digital photo frame, a navigator or any product or component with a display function.

In the description of embodiments of the present disclosure, orientation or positional relationships indicated by terms "middle", "upper", "lower", "front", "back", "vertical", "horizontal", "top", "bottom", "inside", "outside" and the like are based on the orientation or positional relationships shown in the drawings, and are for the purpose of ease of description of the present disclosure and simplification of the description only, but are not intended to indicate or imply that the mentioned device or element must have a specific orientation, or be constructed and operated in a particular orientation, and therefore they should not be construed as limitation to the present disclosure.

Although implementations disclosed in the present disclosure are described above, the described contents are only implementations used for facilitating understanding of the present disclosure, and are not intended to limit the present disclosure. Any person skilled in the art to which the present disclosure pertains may make any modifications and variations in the form and details of implementation without departing from the spirit and the scope of the present disclosure, but the patent protection scope of the present disclosure shall still be subject to the scope defined by the appended claims.

What we claim is:

1. A shift register unit, comprising:
an input circuit, a first control circuit, a second control circuit and an output circuit, wherein
the input circuit is coupled to a signal input terminal, a first power supply terminal, a first clock signal terminal, a first control node and a second control node respectively, and is configured to provide signals of the signal input terminal to the first control node under control of the first clock signal terminal, and provide signals of the first power supply terminal or the first clock signal terminal to the second control node under control of the first clock signal terminal and the first control node;
the first control circuit is coupled to the first control node, the second control node, a second clock signal terminal, the first power supply terminal, a second power supply terminal and a first output terminal respectively, and is configured to provide signals of the second power supply terminal or the second clock signal terminal to the first output terminal under control of the first control node, the second control node and the first power supply terminal;
the second control circuit is coupled to the first output terminal, a third clock signal terminal, a fourth clock signal terminal, the first power supply terminal and a second output terminal respectively, and is configured to provide signals of the first power supply terminal to the second output terminal under control of the first output terminal, the third clock signal terminal and the fourth clock signal terminal; and the output circuit is coupled to the first power supply terminal, the second power supply terminal, the first output terminal and the second output terminal respectively, and is configured to provide signals of the second power supply terminal to the second output terminal under control of the first output terminal, and suppress leakage of the second output terminal through the signals of the first power supply terminal, wherein the output circuit comprises an output sub-circuit and a leakage suppression sub-circuit, wherein the output sub-circuit is coupled to the first output terminal, the second power supply terminal, a third control node and the second output terminal respectively, and is configured to provide signals of the second power supply terminal to the third control node under control of the first output terminal and switch on the third control node and the second output terminal under the control of the first output terminal; and the leakage suppression sub-circuit is coupled to the first power supply terminal, the second output terminal and the third control node respectively, and is configured to provide signals of the first power supply terminal to the third control node under control of the second output terminal.

2. The shift register unit according to claim 1, wherein phases of output signals of the first output terminal are opposite to phases of output signals of the second output terminal.

3. A gate drive circuit, comprising a plurality of cascaded shift register units according to claim 2, wherein a signal input terminal of a first stage shift register unit is coupled to an initial signal terminal, and a first output terminal of a $N^{th}$ stage shift register unit is coupled to a signal input terminal of a $(N+1)^{th}$ stage shift register unit, N being an integer greater than 0.

4. A driving method of a shift register unit, applied to the shift register unit according to claim 2, comprising:

providing, by the input circuit, signals of the signal input terminal to the first control node under control of the first clock signal terminal, and providing signals of the first power supply terminal or the first clock signal terminal to the second control node under control of the first clock signal terminal and the first control node;

providing, by the first control circuit, signals of the second power supply terminal or the second clock signal terminal to the first output terminal under control of the first control node, the second control node and the first power supply terminal;

providing, by the output circuit, signals of the second power supply terminal to the second output terminal under control of the first output terminal, or providing, by the second control circuit, signals of the first power supply terminal to the second output terminal under control of the first output terminal, the third clock signal terminal and the fourth clock signal terminal; and suppressing, by the output circuit, leakage of the second output terminal through the signals of the first power supply terminal.

5. The shift register unit according to claim 1, wherein the output sub-circuit comprises a first transistor and a second transistor, wherein a control electrode of the first transistor is coupled to the first output terminal, a first electrode of the first transistor is coupled to the second power supply terminal, and a second electrode of the first transistor is coupled to the third control node; and a control electrode of the second transistor is coupled to the first output terminal, a first electrode of the second transistor is coupled to the third control node, and a second electrode of the second transistor is coupled to the second output terminal.

6. The shift register unit according to claim 1, wherein the leakage suppression sub-circuit comprises a third transistor, wherein a control electrode of the third transistor is coupled to the second output terminal, a first electrode of the third transistor is coupled to the first power supply terminal, and a second electrode of the third transistor is coupled to the third control node.

7. The shift register unit according to claim 1, wherein the input circuit comprises a fourth transistor, a fifth transistor and a sixth transistor, wherein a control electrode of the fourth transistor is coupled to the first clock signal terminal, a first electrode of the fourth transistor is coupled to the signal input terminal, and a second electrode of the fourth transistor is coupled to the first control node;

a control electrode of the fifth transistor is coupled to the first control node, a first electrode of the fifth transistor is coupled to the first clock signal terminal, and a second electrode of the fifth transistor is coupled to the second control node; and a control electrode of the sixth transistor is coupled to the first clock signal terminal, a first electrode of the sixth transistor is coupled to the first power supply terminal, and a second electrode of the sixth transistor is coupled to the second control node.

8. The shift register unit according to claim 1, wherein the first control circuit comprises a seventh transistor, an eighth transistor, a ninth transistor, a tenth transistor, an eleventh transistor, a first capacitor and a second capacitor, wherein a control electrode of the seventh transistor is coupled to the second control node, a first electrode of the seventh transistor is coupled to the second power supply terminal, and a second electrode of the seventh transistor is coupled to the first output terminal;

a control electrode of the eighth transistor is coupled to a fourth control node, a first electrode of the eighth transistor is coupled to the second clock signal terminal, and a second electrode of the eighth transistor is coupled to the first output terminal;

a control electrode of the ninth transistor is coupled to the second control node, a first electrode of the ninth transistor is coupled to the second power supply terminal, and a second electrode of the ninth transistor is coupled to a fifth control node;

a control electrode of the tenth transistor is coupled to the second clock signal terminal, a first electrode of the tenth transistor is coupled to the fifth control node, and a second electrode of the tenth transistor is coupled to the first control node;

a control electrode of the eleventh transistor is coupled to the first power supply terminal, a first electrode of the eleventh transistor is coupled to the first control node, and a second electrode of the eleventh transistor is coupled to the fourth control node;

a first electrode of the first capacitor is coupled to the first output terminal, and a second electrode of the first capacitor is coupled to the fourth control node; and a first electrode of the second capacitor is coupled to the second power supply terminal, and a second electrode of the second capacitor is coupled to the second control node.

9. The shift register unit according to claim 1, wherein the second control circuit comprises a twelfth transistor, a thirteenth transistor, a fourteenth transistor, a third capacitor and a fourth capacitor, wherein
a control electrode of the twelfth transistor is coupled to the first output terminal, a first electrode of the twelfth transistor is coupled to the second power supply terminal, and a second electrode of the twelfth transistor is coupled to a sixth control node;
a control electrode of the thirteenth transistor is coupled to the third clock signal terminal, a first electrode of the thirteenth transistor is coupled to the sixth control node, and a second electrode of the thirteenth transistor is coupled to the first power supply terminal;
a control electrode of the fourteenth transistor is coupled to the sixth control node, a first electrode of the fourteenth transistor is coupled to the first power supply terminal, and a second electrode of the fourteenth transistor is coupled to the second output terminal;
a first electrode of the third capacitor is coupled to the fourth clock signal terminal, and a second electrode of the third capacitor is coupled to the sixth control node; and
a first electrode of the fourth capacitor is coupled to the sixth control node, and a second electrode of the fourth capacitor is coupled to the second output terminal.

10. The shift register unit according to claim 1, wherein the output circuit comprises a first transistor, a second transistor and a third transistor, wherein
a control electrode of the first transistor is coupled to the first output terminal, a first electrode of the first transistor is coupled to the second power supply terminal, and a second electrode of the first transistor is coupled to the third control node; a control electrode of the second transistor is coupled to the first output terminal, a first electrode of the second transistor is coupled to the third control node, and a second electrode of the second transistor is coupled to the second output terminal; and a control electrode of the third transistor is coupled to the second output terminal, a first electrode of the third transistor is coupled to the first power supply terminal, and a second electrode of the third transistor is coupled to the third control node;
the input circuit comprises a fourth transistor, a fifth transistor and a sixth transistor, wherein a control electrode of the fourth transistor is coupled to the first clock signal terminal, a first electrode of the fourth transistor is coupled to the signal input terminal, and a second electrode of the fourth transistor is coupled to the first control node; a control electrode of the fifth transistor is coupled to the first control node, a first electrode of the fifth transistor is coupled to the first clock signal terminal, and a second electrode of the fifth transistor is coupled to the second control node; and a control electrode of the sixth transistor is coupled to the first clock signal terminal, a first electrode of the sixth transistor is coupled to the first power supply terminal, and a second electrode of the sixth transistor is coupled to the second control node;
the first control circuit comprises a seventh transistor, an eighth transistor, a ninth transistor, a tenth transistor, an eleventh transistor, a first capacitor and a second capacitor, wherein a control electrode of the seventh transistor is coupled to the second control node, a first electrode of the seventh transistor is coupled to the second power supply terminal, and a second electrode of the seventh transistor is coupled to the first output terminal; a control electrode of the eighth transistor is coupled to the fourth control node, a first electrode of the eighth transistor is coupled to the second clock signal terminal, and a second electrode of the eighth transistor is coupled to the first output terminal; a control electrode of the ninth transistor is coupled to the second control node, a first electrode of the ninth transistor is coupled to the second power supply terminal, and a second electrode of the ninth transistor is coupled to the fifth control node; a control electrode of the tenth transistor is coupled to the second clock signal terminal, a first electrode of the tenth transistor is coupled to the fifth control node, and a second electrode of the tenth transistor is coupled to the first control node; a control electrode of the eleventh transistor is coupled to the first power supply terminal, a first electrode of the eleventh transistor is coupled to the first control node, and a second electrode of the eleventh transistor is coupled to the fourth control node; a first electrode of the first capacitor is coupled to the first output terminal, and a second electrode of the first capacitor is coupled to the fourth control node; and a first electrode of the second capacitor is coupled to the second power supply terminal, and a second electrode of the second capacitor is coupled to the second control node; and
the second control circuit comprises a twelfth transistor, a thirteenth transistor, a fourteenth transistor, a third capacitor and a fourth capacitor, wherein a control electrode of the twelfth transistor is coupled to the first output terminal, a first electrode of the twelfth transistor is coupled to the second power supply terminal, and a second electrode of the twelfth transistor is coupled to the sixth control node; a control electrode of the thirteenth transistor is coupled to the third clock signal terminal, a first electrode of the thirteenth transistor is coupled to the sixth control node, and a second electrode of the thirteenth transistor is coupled to the first power supply terminal; a control electrode of the fourteenth transistor is coupled to the sixth control node, a first electrode of the fourteenth transistor is coupled to the first power supply terminal, and a second electrode of the fourteenth transistor is coupled to the second output terminal; a first electrode of the third capacitor is coupled to the fourth clock signal terminal, and a second electrode of the third capacitor is coupled to the sixth control node; and a first electrode of the fourth capacitor is coupled to the sixth control node, and a second electrode of the fourth capacitor is coupled to the second output terminal.

11. The shift register unit according to claim 10, wherein the first transistor, the third transistor, the fourth transistor, the eighth transistor, the ninth transistor and the twelfth transistor are all double-gate transistors, and a control electrode of each of the double-gate transistors comprises a first control electrode and a second control electrode, wherein the first control electrode is coupled to the second control electrode.

12. The shift register unit according to claim 11, wherein the double gate transistor comprises the first control electrode, an active layer, the second control electrode, a first electrode and a second electrode disposed on a substrate; the first control electrode is located below the active layer, the second control electrode is located above the active layer, the active layer comprises a channel region and doped regions, the first and second electrodes are coupled to the doped regions at both ends of the channel region of the active layer respectively, and the first control electrode is coupled to the second electrode.

13. The shift register unit according to claim 10, wherein the first transistor to the fourteenth transistor are all double-gate transistors, and a control electrode of each of the double-gate transistor comprises a first control electrode and a second control electrode, wherein the first control electrode is coupled to the second control electrode.

14. The shift register unit according to claim 13, wherein the double gate transistor comprises the first control electrode, an active layer, the second control electrode, a first electrode and a second electrode disposed on a substrate; the first control electrode is located below the active layer, the second control electrode is located above the active layer, the active layer comprises a channel region and doped regions, the first and second electrodes are coupled to the doped regions at both ends of the channel region of the active layer respectively, and the first control electrode is coupled to the second electrode.

15. A gate drive circuit, comprising a plurality of cascaded shift register units according to claim 1, wherein
a signal input terminal of a first stage shift register unit is coupled to an initial signal terminal, and a first output terminal of a $N^{th}$ stage shift register unit is coupled to a signal input terminal of a $(N+1)^{th}$ stage shift register unit, N being an integer greater than 0.

16. A display device, comprising a gate drive circuit according to claim 15.

17. A driving method of a shift register unit, applied to the shift register unit according to claim 1, comprising:
providing, by the input circuit, signals of the signal input terminal to the first control node under control of the first clock signal terminal, and providing signals of the first power supply terminal or the first clock signal terminal to the second control node under control of the first clock signal terminal and the first control node;
providing, by the first control circuit, signals of the second power supply terminal or the second clock signal terminal to the first output terminal under control of the first control node, the second control node and the first power supply terminal;
providing, by the output circuit, signals of the second power supply terminal to the second output terminal under control of the first output terminal, or providing, by the second control circuit, signals of the first power supply terminal to the second output terminal under control of the first output terminal, the third clock signal terminal and the fourth clock signal terminal; and
suppressing, by the output circuit, leakage of the second output terminal through the signals of the first power supply terminal.

18. The driving method according to claim 17, wherein a first transistor to a fourteenth transistor are all p-type transistors;
a falling edge time of signals of the first clock signal terminal is later than a rising edge time of signals of the second clock signal terminal, and earlier than a rising edge time of the signals of the first clock signal terminal, and the rising edge time of the signals of the first clock signal terminal is earlier than a falling edge time of the signals of the second clock signal terminal; and
a falling edge time of signals of the third clock signal terminal is the same as the rising edge time of the signals of the second clock signal terminal, and a rising edge time of the signals of the third clock signal terminal is earlier than the rising edge time of the signals of the first clock signal terminal; a falling edge time of signals of the fourth clock signal terminal is the same as the rising edge time of the signals of the first clock signal terminal, and a rising edge time of the signals of the fourth clock signal terminal is earlier than the rising edge time of the signals of the second clock signal terminal.

19. A gate drive circuit, comprising a plurality of cascaded shift register units according to claim 1, wherein
a signal input terminal of a first stage shift register unit is coupled to an initial signal terminal, and a first output terminal of a $N^{th}$ stage shift register unit is coupled to a signal input terminal of a $(N+1)^{th}$ stage shift register unit, N being an integer greater than 0.

* * * * *